US010288965B2

(12) United States Patent
Nakata et al.

(10) Patent No.: US 10,288,965 B2
(45) Date of Patent: May 14, 2019

(54) METHOD FOR PRODUCING SEMICONDUCTOR DEVICE FOR HIGH DEFINITION

(71) Applicant: Sharp Kabushiki Kaisha, Sakai, Osaka (JP)

(72) Inventors: Yukinobu Nakata, Sakai (JP); Tetsuo Fujita, Sakai (JP); Yoshihito Hara, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 205 days.

(21) Appl. No.: 15/423,759

(22) Filed: Feb. 3, 2017

(65) Prior Publication Data

US 2017/0146838 A1 May 25, 2017

Related U.S. Application Data

(62) Division of application No. 14/358,778, filed as application No. PCT/JP2012/079669 on Nov. 15, 2012, now Pat. No. 9,599,871.

(30) Foreign Application Priority Data

Nov. 18, 2011 (JP) ................................. 2011-253342

(51) Int. Cl.
*G02F 1/136* (2006.01)
*G02F 1/1368* (2006.01)
(Continued)

(52) U.S. Cl.
CPC ...... *G02F 1/1368* (2013.01); *G02F 1/136227* (2013.01); *G02F 1/136286* (2013.01);
(Continued)

(58) Field of Classification Search
CPC ... G02F 1/136227; G02F 2001/134372; G02F 1/13458; H01L 27/124
See application file for complete search history.

(56) References Cited

U.S. PATENT DOCUMENTS

| 7,636,144 B2 * | 12/2009 | Horiguchi | ......... G02F 1/134309 349/141 |
| 2010/0201932 A1 * | 8/2010 | Gotoh | ................. G02F 1/13439 349/141 |
| 2011/0210355 A1 * | 9/2011 | Yamazaki | ........... H01L 27/1225 257/98 |

OTHER PUBLICATIONS

Nakata et al., "Semiconductor Device, Display Device, and Method for Producing Semiconductor Device", U.S. Appl. No. 14/358,778, filed May 16, 2014.

* cited by examiner

*Primary Examiner* — Paisley L Arendt

(74) *Attorney, Agent, or Firm* — Keating & Bennett, LLP

(57) ABSTRACT

This semiconductor device (100) includes: a thin-film transistor (101); an interlevel insulating layer (14) including a first insulating layer (12); a first transparent conductive layer (15) formed on the interlevel insulating layer and having a first hole (15*p*); a dielectric layer (17) covering the side surface of the first transparent conductive layer closer to the first hole; and a second transparent conductive layer (19*a*) overlapping at least partially with the first transparent conductive layer via the dielectric layer, which has a second hole (17*p*). The first insulating layer has a third hole (12*p*). The interlevel insulating layer and dielectric layer have a first contact hole (CH1), the sidewall of which includes the side surfaces of the second and third holes (17*p*, 12*p*). At least a part of the side surface of the third hole is aligned with that of the second hole. The second transparent conductive layer contacts with the drain electrode in the first (Continued)

contact hole to form a contact portion (105), which at least partially overlaps with a gate line layer when viewed along a normal to a substrate.

4 Claims, 24 Drawing Sheets

(51) Int. Cl.
| | |
|---|---|
| *G02F 1/1362* | (2006.01) |
| *H01L 27/12* | (2006.01) |
| *H01L 29/786* | (2006.01) |
| *H01L 21/4757* | (2006.01) |
| *H01L 29/24* | (2006.01) |
| *H01L 29/66* | (2006.01) |
| *G02F 1/1343* | (2006.01) |
| *G02F 1/1345* | (2006.01) |

(52) U.S. Cl.
CPC ...... *H01L 21/47573* (2013.01); *H01L 27/124* (2013.01); *H01L 27/1225* (2013.01); *H01L 27/1248* (2013.01); *H01L 27/1259* (2013.01); *H01L 27/1262* (2013.01); *H01L 29/24* (2013.01); *H01L 29/66969* (2013.01); *H01L 29/7869* (2013.01); *G02F 1/13458* (2013.01); *G02F 2001/134372* (2013.01); *G02F 2202/10* (2013.01)

FIG.2
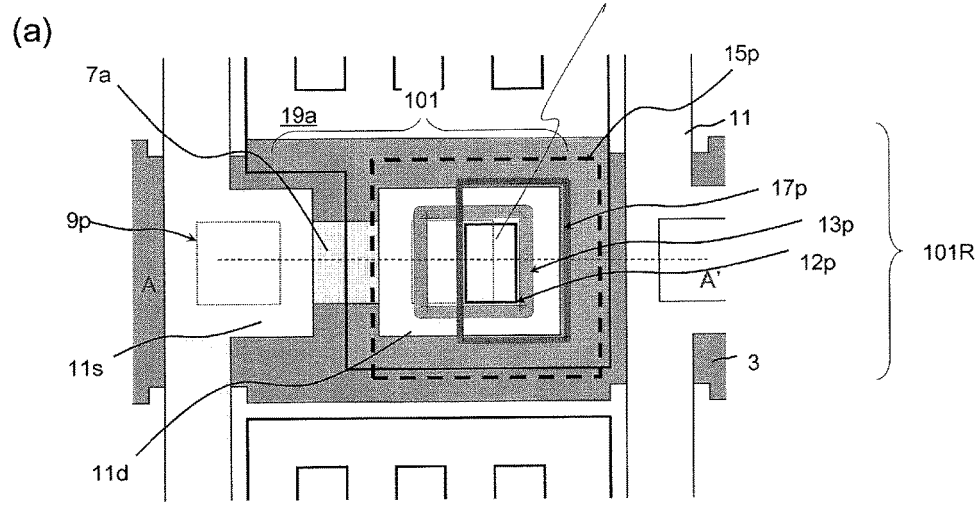
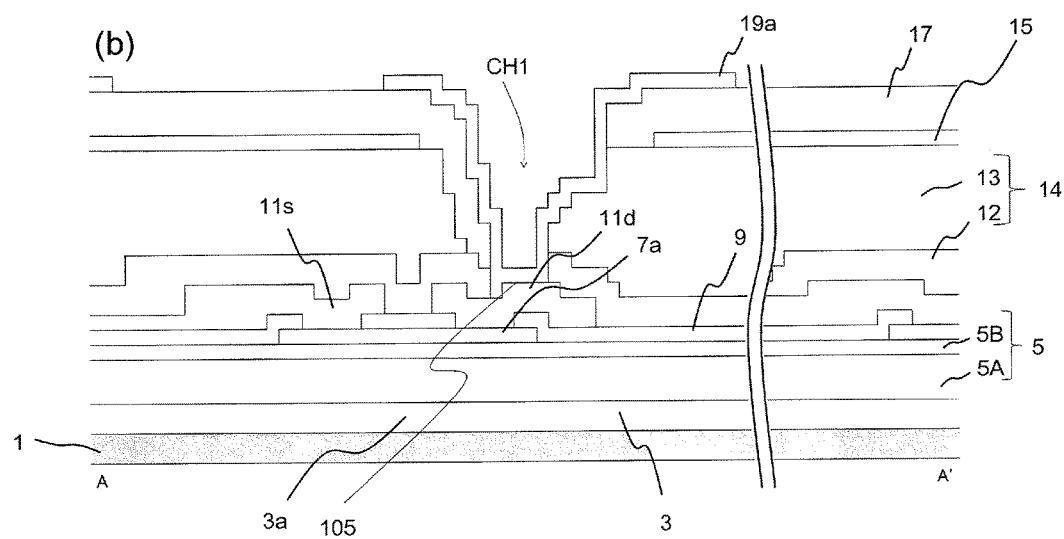

FIG.3
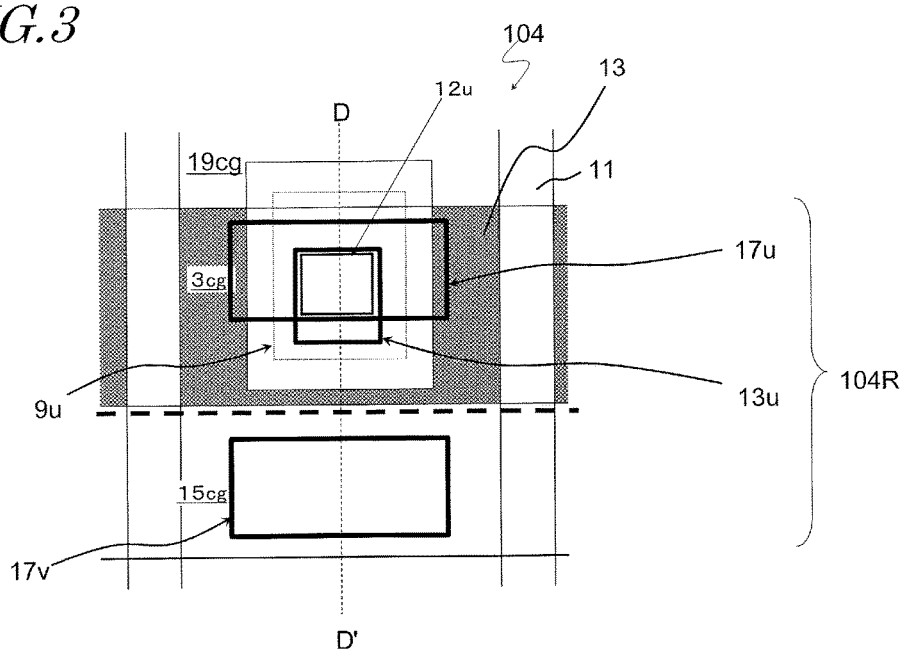
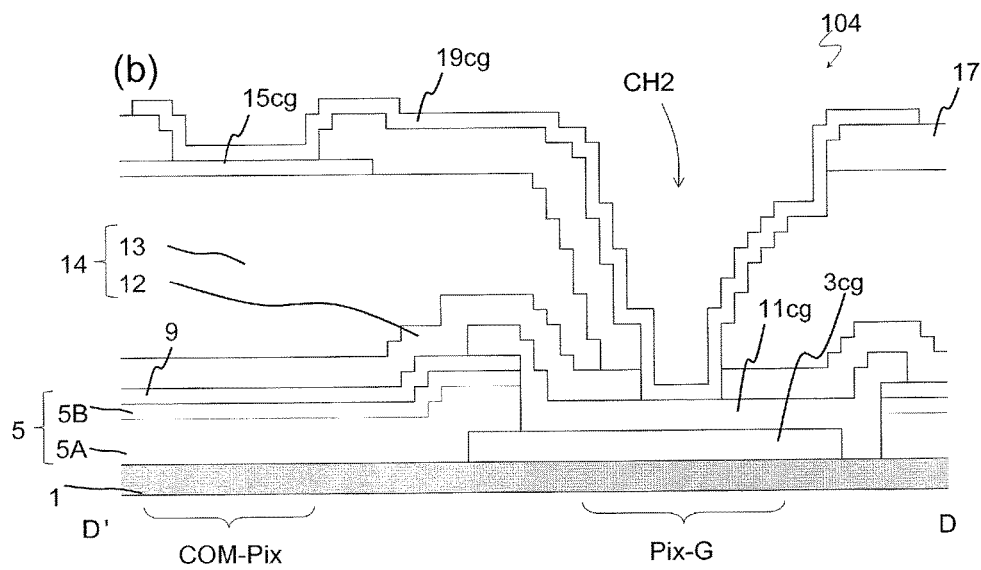

FIG.4
(a)
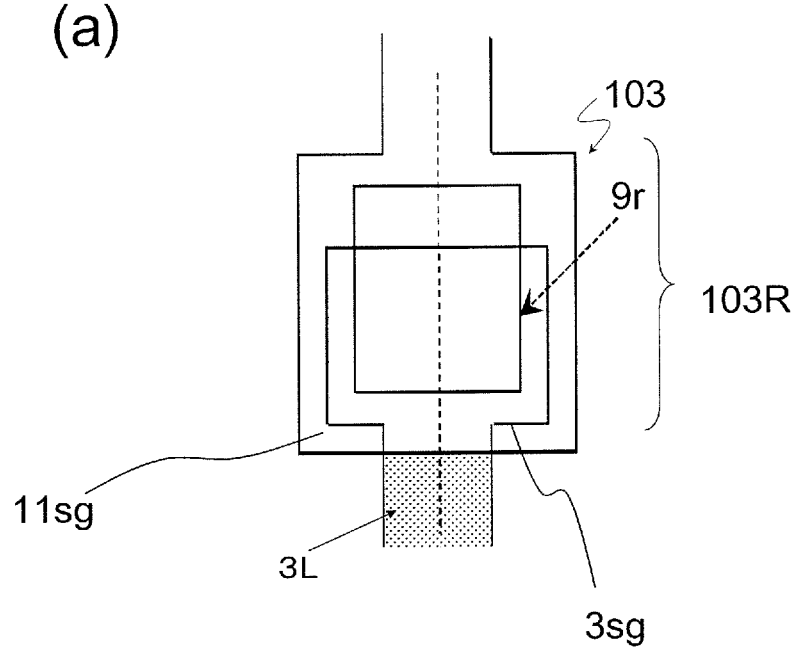
(b)
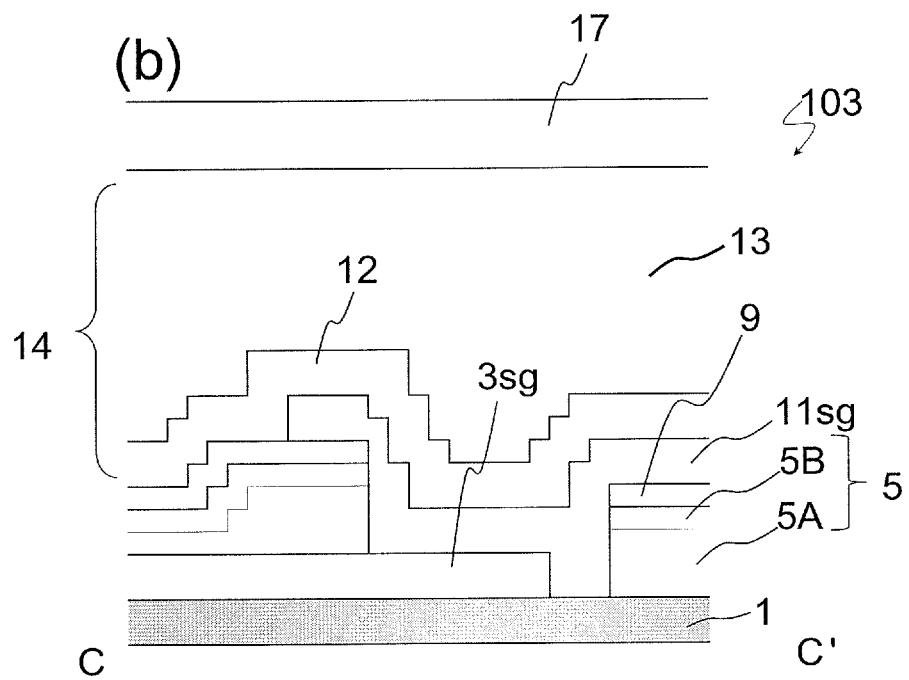

FIG.5
(a)
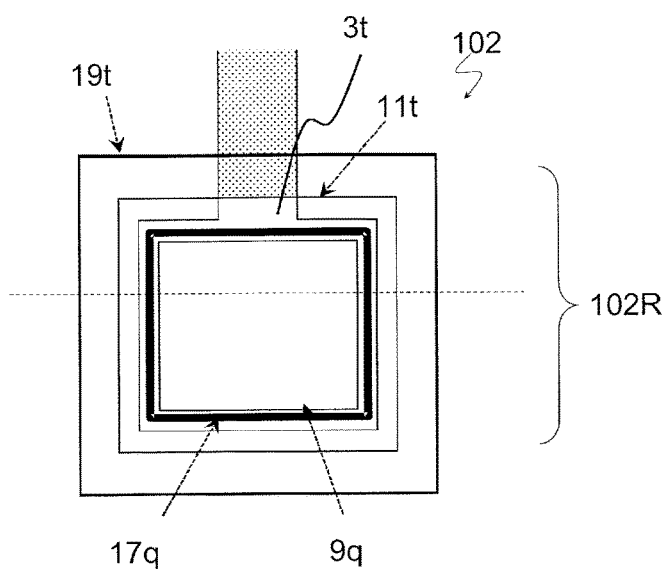
(b)
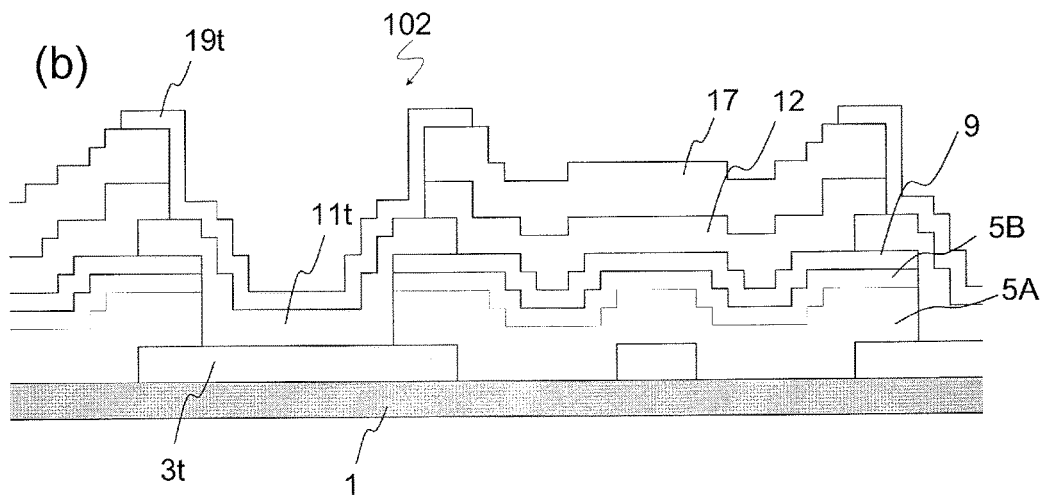

FIG.6

| | |
|---|---|
| STEP 1 | DEPOSIT GATE-LINE-TO-BE METAL FILM (GT) BY SPUTTERING; |
| | PERFORM PHOTOLITHOGRAPHY (1) ON GT; |
| | PERFORM ETCHING; AND |
| | STRIP PHOTORESIST |
| STEP 2 | FORM GATE INSULATING LAYER (GI) BY CVD; |
| | DEPOSIT IGZO BY SPUTTERING; |
| | PERFORM PHOTOLITHOGRAPHY (2) ON IGZO; |
| | PERFORM WET ETCHING; AND |
| | STRIP PHOTORESIST |
| STEP 3 | FORM PROTECTIVE LAYER (ES) BY CVD; |
| | PERFORM PHOTOLITHOGRAPHY (3) ON ES; |
| | PERFORM ETCHING (ES/GI SIMULTANEOUS ETCHING); AND |
| | STRIP PHOTORESIST |
| STEP 4 | DEPOSIT SOURCE-LINE-TO-BE METAL FILM (SD) BY SPUTTERING; |
| | PERFORM PHOTOLITHOGRAPHY (4) ON SD; |
| | PERFORM ETCHING; AND |
| | STRIP PHOTORESIST |
| STEP 5 | FORM FIRST INSULATING LAYER (Pas1) BY CVD; |
| | PERFORM PHOTOLITHOGRAPHY (5) ON SECOND INSULATING LAYER (PHOTOSENSITIVE RESIN FILM); AND |
| | BAKE |
| STEP 6 | DEPOSIT FIRST TRANSPARENT CONDUCTIVE LAYER (COM) BY SPUTTERING; |
| | PERFORM PHOTOLITHOGRAPHY (6) ON COM; |
| | PERFORM WET ETCHING; AND |
| | STRIP PHOTORESIST |
| STEP 7 | FORM DIELECTRIC LAYER (Pas2) BY CVD; |
| | PERFORM PHOTOLITHOGRAPHY (7) ON Pas2; |
| | PERFORM ETCHING (Pas1/Pas2 SIMULTANEOUS ETCHING); AND |
| | STRIP PHOTORESIST |
| STEP 8 | DEPOSIT SECOND TRANSPARENT CONDUCTIVE LAYER (Pix) BY SPUTTERING; |
| | PERFORM PHOTOLITHOGRAPHY (8) ON Pix; |
| | PERFORM ETCHING; AND |
| | STRIP PHOTORESIST |

FIG.7
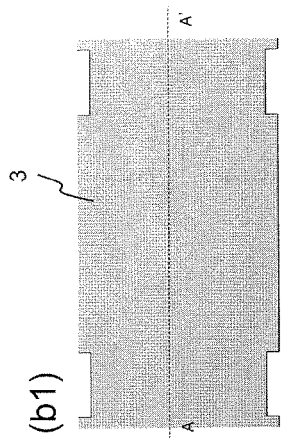
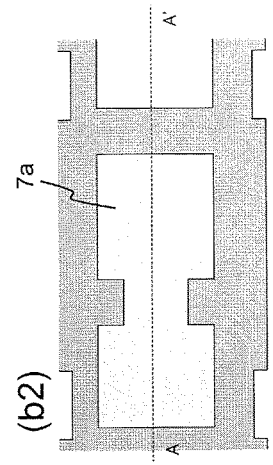
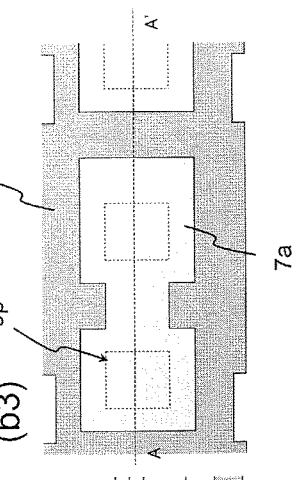
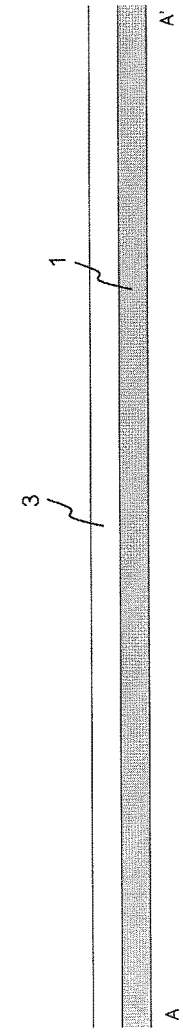
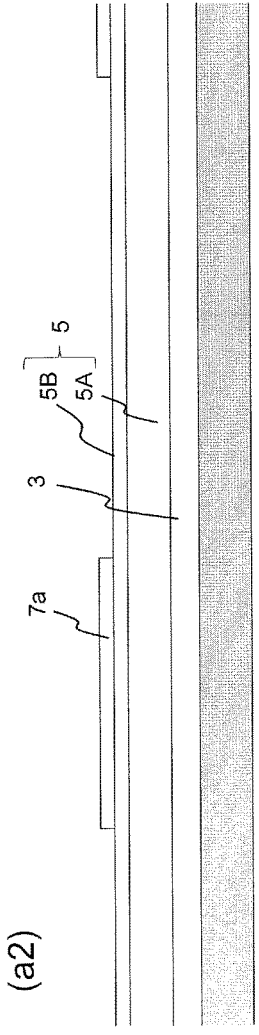
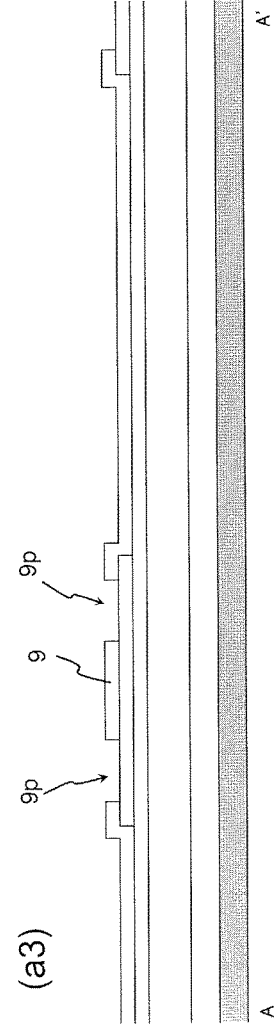

FIG.9
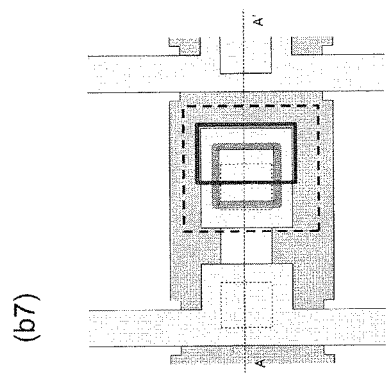
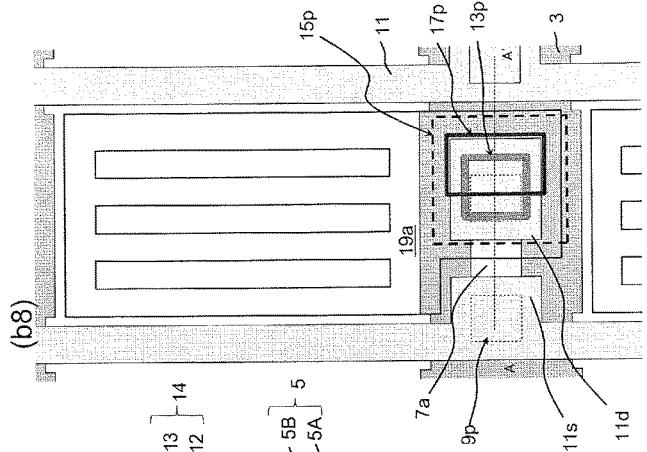
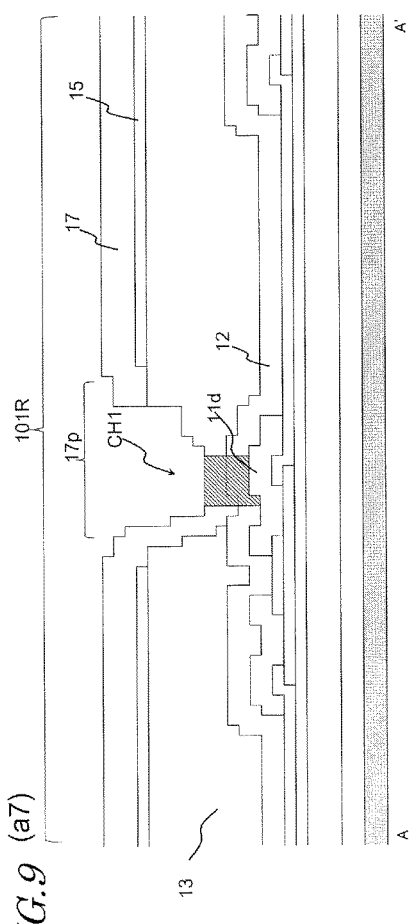
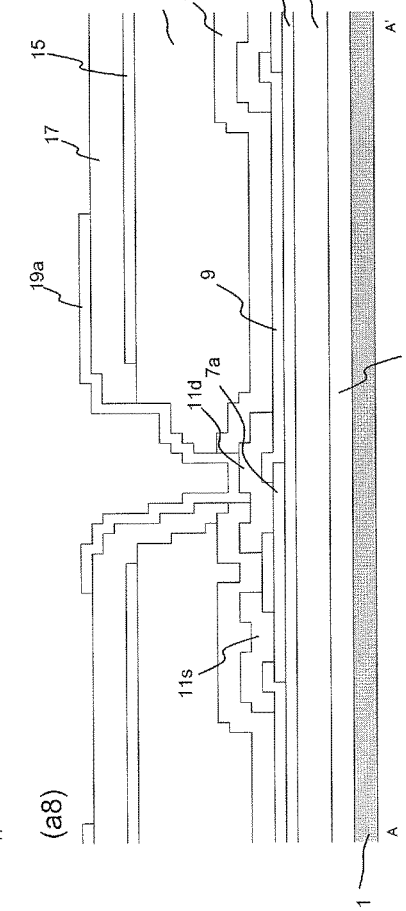

FIG.11
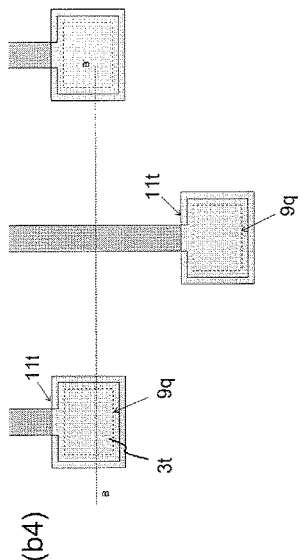
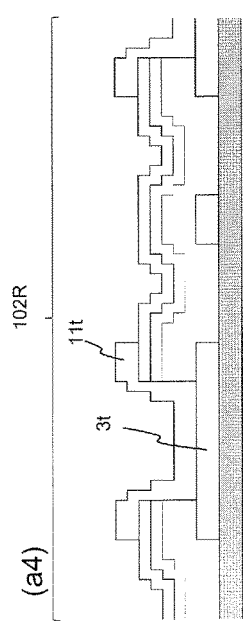
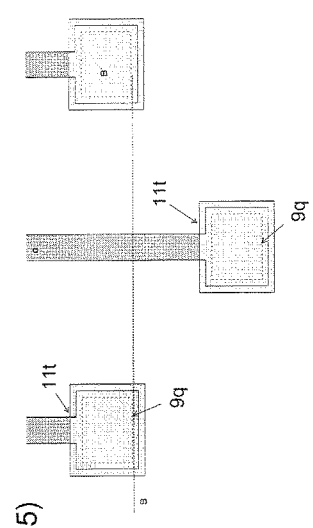
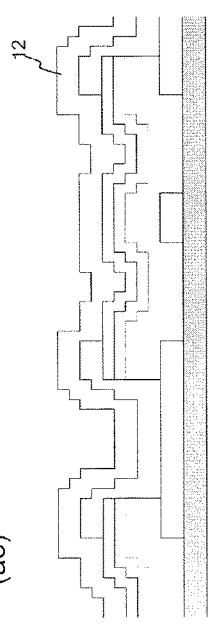
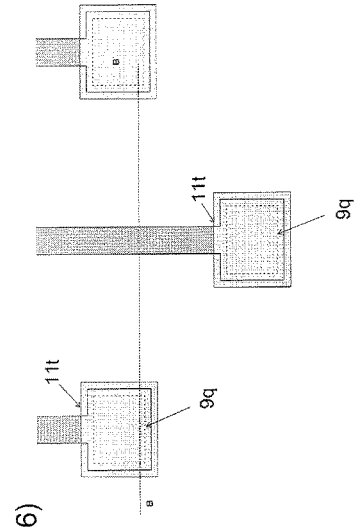

FIG.14
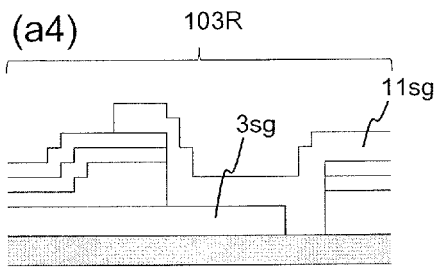
(a4)
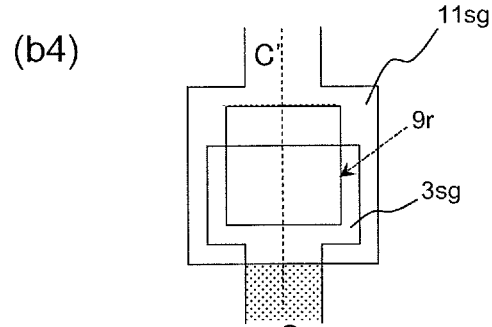
(b4)
(a5)
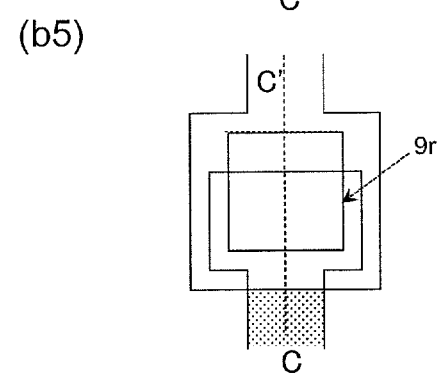
(b5)
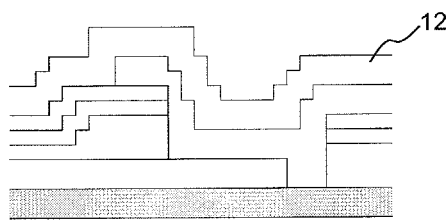
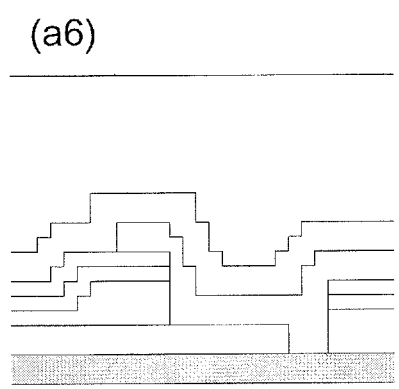
(a6)
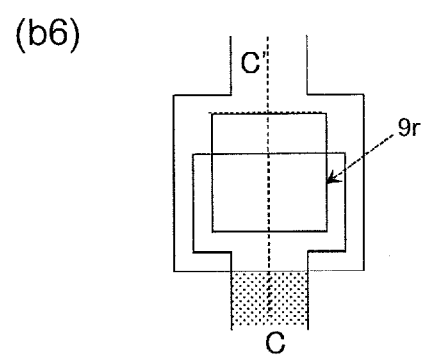
(b6)

FIG.15
(a7)
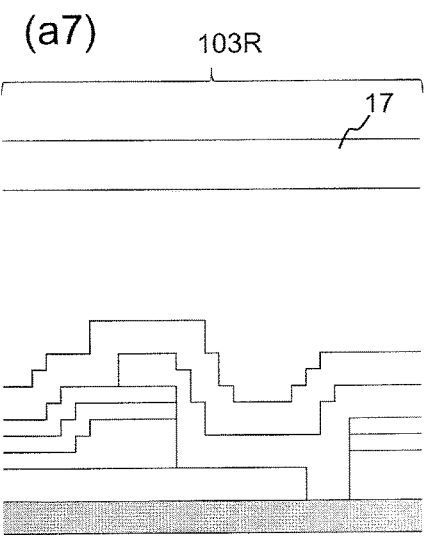
(b7)
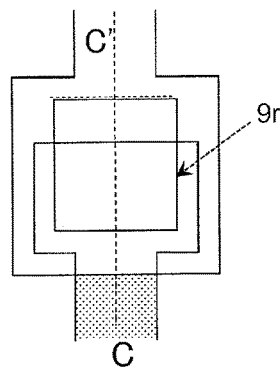
(a8)
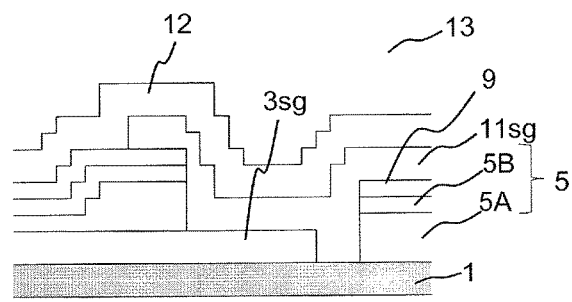
(b8)
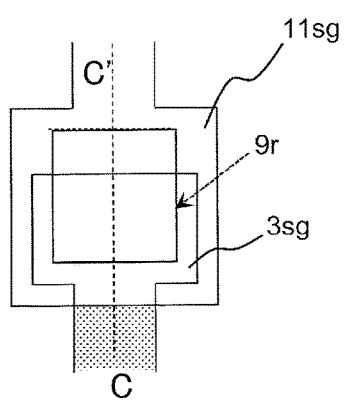

FIG. 19
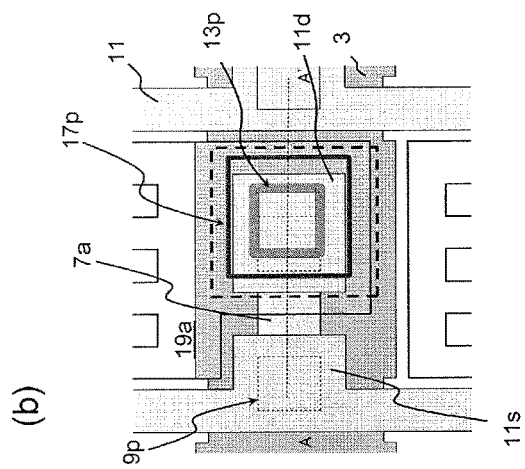
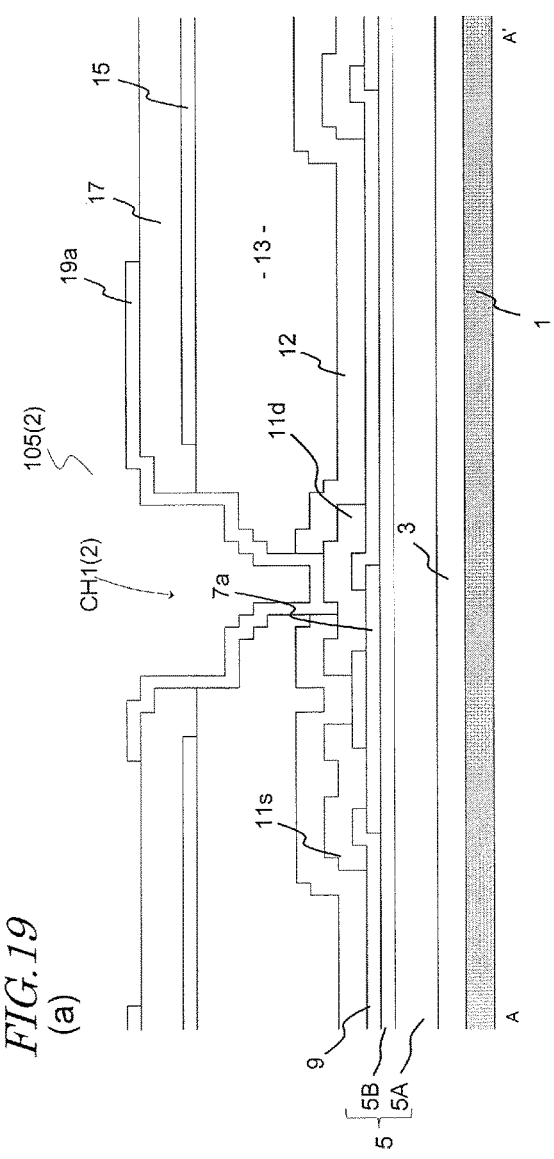

FIG.22
(a)
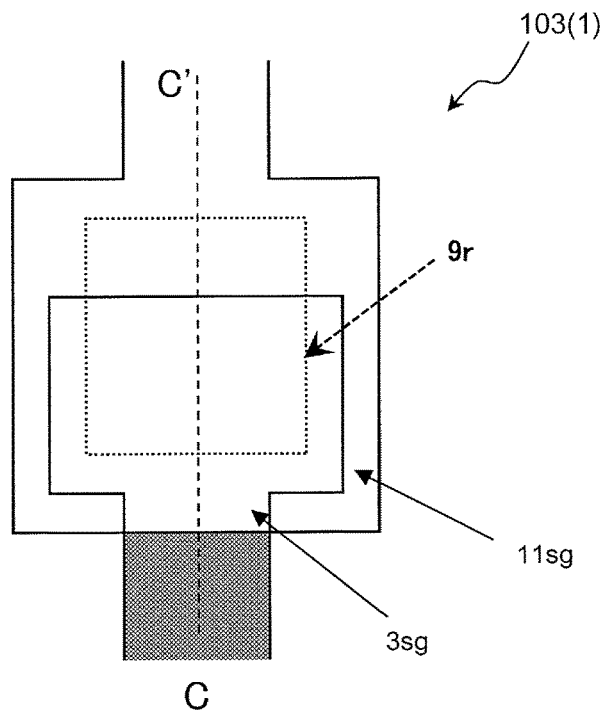
(b)
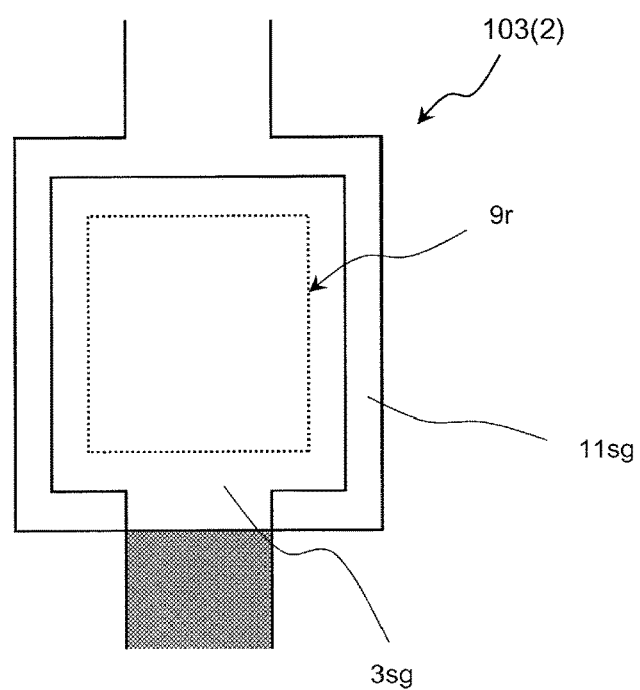

METHOD FOR PRODUCING SEMICONDUCTOR DEVICE FOR HIGH DEFINITION

TECHNICAL FIELD

The present invention relates to a semiconductor device and display device including a thin-film transistor, and a method for fabricating such a semiconductor device including a thin-film transistor.

BACKGROUND ART

An active-matrix-addressed liquid crystal display device generally includes a substrate on which thin-film transistors (which will also be referred to herein as "TFTs") are provided as switching elements for respective pixels (such a substrate will be referred to herein as a "TFT substrate"), a counter substrate on which a counter electrode, color filters and other members are arranged, a liquid crystal layer which is interposed between the TFT substrate and the counter substrate, and a pair of electrodes to apply a voltage to the liquid crystal layer.

Various modes of operation have been proposed and adopted for active-matrix-addressed liquid crystal display devices according to their intended application. Examples of those modes of operation include a TN (Twisted Nematic) mode, a VA (Vertical Alignment) mode, an IPS (In-Plane-Switching) mode and an FFS (Fringe Field Switching) mode.

Among these modes, the TN and VA modes are longitudinal electric field modes in which a pair of electrodes that face each other with a liquid crystal layer interposed between them apply an electric field to liquid crystal molecules. On the other hand, the IPS and FFS modes are lateral electric field modes in which a pair of electrodes is provided for one substrate to apply an electric field to liquid crystal molecules parallel to the surface of the substrate (i.e., laterally). According to the lateral electric field method, liquid crystal molecules do not rise with respect to the substrate, and therefore, a wider viewing angle can be achieved than in the longitudinal electric field method, which is beneficial.

Among various modes of operation by the lateral electric field method, in an IPS mode liquid crystal display device, a pair of comb electrodes are formed on a TFT substrate by patterning a metal film, and therefore, the transmittance and aperture ratio will decrease, which is a problem. On the other hand, in an FFS mode liquid crystal display device, the electrodes to be formed on the TFT substrate are transparent, and therefore, the aperture ratio and transmittance can be increased.

FFS mode liquid crystal display devices are disclosed in Patent Documents Nos. 1 and 2, for example.

On the TFT substrate of these display devices, a common electrode and a pixel electrode are arranged over each TFT with an insulating film interposed between them. Among these electrodes, a hole is cut as a slit through the electrode which is located closer to the liquid crystal layer (e.g., the pixel electrode). As a result, generated is an electric field which is represented by electric lines of force that are emitted from the pixel electrode, pass through the liquid crystal layer and the slit hole, and then reach the common electrode. This electric field has a lateral component with respect to the liquid crystal layer. Consequently, a lateral electric field can be applied to the liquid crystal layer.

Recently, people have proposed that an oxide semiconductor be used as a material for the active layer of a TFT instead of a silicon semiconductor. Such a TFT will be referred to herein as an "oxide semiconductor TFT". Since an oxide semiconductor has higher mobility than amorphous silicon, the oxide semiconductor TFT can operate at higher speeds than an amorphous silicon TFT. For example, Patent Document No. 3 discloses an active-matrix-addressed liquid crystal display device which uses an oxide semiconductor TFT as a switching element.

CITATION LIST

Patent Literature

Patent Document No. 1: Japanese Laid-Open Patent Publication No. 2008-32899
Patent Document No. 2: Japanese Laid-Open Patent Publication No. 2002-182230
Patent Document No. 3: Japanese Laid-Open Patent Publication No. 2010-230744

SUMMARY OF INVENTION

Technical Problem

In a TFT substrate including electrodes which are stacked in two layers over each TFT as in a TFT substrate for use in an FFS mode liquid crystal display device, if each of those electrodes in two layers is formed out of a transparent conductive film, the aperture ratio and transmittance can be increased compared to a TFT substrate for use in an IPS mode liquid crystal display device, as described above. In addition, by using an oxide semiconductor TFT, the size of each transistor section on the TFT substrate can be reduced, and therefore, the transmittance can be further increased.

However, as the applications of liquid crystal display devices have become even broader these days and as there are growing demands for high-spec liquid crystal display devices, the TFT substrate should have even higher definition and transmittance.

The present inventors perfected our invention in order to overcome these problems by further increasing the transmittance and definition of a semiconductor device such as a TFT substrate or a liquid crystal display device that uses such a semiconductor device.

Solution to Problem

A semiconductor device according to an embodiment of the present invention includes a substrate and a thin-film transistor, a gate line layer and a source line layer which are supported by the substrate. The gate line layer includes a gate line and the thin-film transistor's gate electrode. The source line layer includes a source line and the thin-film transistor's source and drain electrodes. The thin-film transistor includes the gate electrode, a gate insulating layer formed over the gate electrode, a semiconductor layer stacked on the gate insulating layer, and the source and drain electrodes. The semiconductor device further includes: an interlevel insulating layer which is formed over the source and drain electrodes and which includes a first insulating layer that contacts at least with the surface of the drain electrode; a first transparent conductive layer which is formed on the interlevel insulating layer and which has a first hole; a dielectric layer which is formed on the first transparent conductive layer and which covers a side surface of the first hole of the first transparent conductive layer; and a second transparent conductive layer formed over the dielectric layer so as to overlap with at least a portion of the first transparent conductive layer with the dielectric layer interposed between them. The dielectric layer has a second hole and the first insulating layer has a third hole. The interlevel insulating layer and the dielectric layer have a first contact hole, the sidewall of which includes respective side surfaces of the second and third holes. At least a portion of the side surface of the third hole is aligned with the side surface of the second hole. The second transparent conductive layer contacts with the drain electrode inside the first contact hole, thereby forming a contact portion where the second transparent conductive layer and the drain electrode contact with each other. And when viewed along a normal to the substrate, at least a part of the contact portion overlaps with the gate line layer.

In one embodiment, the semiconductor layer is an oxide semiconductor layer.

The oxide semiconductor layer may be an IGZO layer.

In one embodiment, when viewed along a normal to the substrate, the contact portion overlaps in its entirety with the gate line layer.

In one embodiment, the interlevel insulating layer further includes a second insulating layer which is arranged between the first insulating layer and the first transparent conductive layer, the first insulating layer is an inorganic insulating layer, and the second insulating layer is an organic insulating layer.

In one embodiment, the second insulating layer has a fourth hole. When viewed along a normal to the substrate, the outer edge of the second hole is located at least partially inside the outer edge of the fourth hole. And at least a portion of the side surface of the fourth hole of the second insulating layer is covered with the dielectric layer.

In one embodiment, when viewed along a normal to the substrate, the outer edge of the second hole is located in its entirety inside the outer edge of the fourth hole.

In one embodiment, the semiconductor device further includes a first connecting portion formed on the substrate. The gate line layer includes a first lower conductive layer. The source line layer includes a first upper conductive layer formed in contact with the first lower conductive layer. The first connecting portion includes: the first lower conductive layer; the first upper conductive layer; the interlevel insulating layer and the dielectric layer extended onto the first upper conductive layer; an upper transparent connecting layer formed on the dielectric layer out of the same conductive film as the second transparent conductive layer; and a lower transparent connecting layer formed between the interlevel insulating layer and the dielectric layer out of the same conductive film as the first transparent conductive layer. The interlevel insulating layer and the dielectric layer have a second contact hole, in which the upper transparent connecting layer contacts with a portion of the first upper conductive layer. And the dielectric layer has a third contact hole, in which the upper transparent connecting layer contacts with a portion of the lower transparent connecting layer.

In one embodiment, the dielectric layer has a fifth hole, the first insulating layer has a sixth hole, the sidewall of the second contact hole includes respective side surfaces of the fifth and sixth holes, and at least a portion of the side surface of the sixth hole is aligned with the side surface of the fifth hole.

In one embodiment, the semiconductor device further includes a terminal portion formed on the substrate. The gate line layer includes a second lower conductive layer. The source line layer includes a second upper conductive layer formed in contact with the second lower conductive layer. The terminal portion includes: the second lower conductive layer; the second upper conductive layer; the first insulating layer and the dielectric layer which are extended onto the second upper conductive layer; and an external connecting layer formed on the dielectric layer out of the same conductive film as the second transparent conductive layer. The first insulating layer and the dielectric layer have a fourth contact hole, the respective side surfaces of the first insulating layer and dielectric layer are aligned with each other on the sidewall of the fourth contact hole. And the external connecting layer contacts with a portion of the second upper conductive layer in the fourth contact hole.

A semiconductor device according to another embodiment of the present invention includes a substrate and a thin-film transistor, a gate line layer, a source line layer and a terminal portion supported by the substrate. The gate line layer includes a gate line, the thin-film transistor's gate electrode and the terminal portion's second lower conductive layer. The source line layer includes a source line, the thin-film transistor's source and drain electrodes, and a second upper conductive layer formed in contact with the second lower conductive layer. The thin-film transistor includes the gate electrode, a gate insulating layer formed over the gate electrode, a semiconductor layer stacked on the gate insulating layer, and the source and drain electrodes. The semiconductor device further includes: an interlevel insulating layer which is formed over the source and drain electrodes and which includes a first insulating layer that contacts at least with the surface of the drain electrode; a first transparent conductive layer which is formed on the interlevel insulating layer and which has a first hole; a dielectric layer which is formed on the first transparent conductive layer and which covers a side surface of the first transparent conductive layer that is located closer to the first hole; and a second transparent conductive layer formed over the dielectric layer so as to overlap with at least a portion of the first transparent conductive layer with the dielectric layer interposed between them. The dielectric layer has a second hole and the first insulating layer has a third hole. The interlevel insulating layer and the dielectric layer have a first contact hole, the sidewall of which includes respective side surfaces of the second and third holes. At least a portion of the side surface of the third hole is aligned with the side surface of the second hole. The second transparent conductive layer contacts with the drain electrode inside the first contact hole, thereby forming a contact portion where the second transparent conductive layer and the drain electrode contact with each other. When viewed along a normal to the substrate, at least a part of the contact portion overlaps with the gate line layer. The terminal portion includes: the second lower conductive layer; the second upper conductive layer; the first insulating layer and the dielectric layer extended onto the second upper conductive layer; and an external connecting layer formed on the dielectric layer out of the same conductive film as the second transparent conductive layer. The first insulating layer and the dielectric layer have a fourth contact hole. The respective side surfaces of the first insulating layer and dielectric layer are aligned with each other on the sidewall of the fourth contact hole. And the external connecting layer contacts with a portion of the second upper conductive layer in the fourth contact hole.

In one embodiment, the semiconductor device further includes a protective layer formed between the semiconductor layer and the source and drain electrodes so as to contact with at least a portion of the semiconductor layer to be a channel region.

In one embodiment, when viewed along a normal to the substrate, at least a part of the contact portion overlaps with the gate line or the gate electrode.

A display device according to an embodiment of the present invention includes: a semiconductor device according to any of the embodiments described above; a counter substrate which is arranged so as to face the semiconductor device; and a liquid crystal layer which is arranged between the counter substrate and the semiconductor device. The display device includes a plurality of pixels which are arranged in a matrix pattern. The second transparent conductive layer is divided into multiple portions which are associated with respective pixels so that each portion functions a pixel electrode.

In one embodiment, the first transparent conductive layer covers each pixel almost entirely.

In one embodiment, the second transparent conductive layer has a plurality of holes cut as slits in each pixel, and the first transparent conductive layer is present at least under those holes and functions as a common electrode.

A semiconductor device fabricating method according to an embodiment of the present invention is a method for fabricating a semiconductor device including a thin-film transistor, and includes the steps of: (A) forming a thin-film transistor on a substrate by forming a gate line layer including a gate line and a gate electrode, forming a gate insulating layer on the gate electrode, forming a semiconductor layer on the gate insulating layer, and forming a source line layer including source and drain electrodes; (B) forming an interlevel insulating layer which covers the thin-film transistor and which includes a first insulating layer that contacts at least with the drain electrode; (C) forming a first transparent conductive layer with a first hole on the interlevel insulating layer; (D) forming a dielectric layer on the first transparent conductive layer and inside the first hole; (E) etching the dielectric layer and the first insulating layer simultaneously, thereby cutting a first contact hole that exposes a portion of the drain electrode, the side surface of the first hole being covered with the dielectric layer and being not exposed on the sidewall of the first contact hole; and (F) forming a second transparent conductive layer which contacts with the drain electrode in the first contact hole on the dielectric layer and in the first contact hole. When viewed along a normal to the substrate, at least a part of a contact portion where the drain electrode and the second transparent conductive layer contact with each other in the first contact hole overlaps with the gate line layer.

In one embodiment, the interlevel insulating layer includes the first insulating layer and a second insulating layer. The step (B) includes the steps of: forming the first insulating layer out of an inorganic insulating film; forming the second insulating layer out of an organic insulating film on the first insulating layer; and cutting a fourth hole through the second insulating layer. In the step (D), the dielectric layer is formed on the first transparent conductive layer and inside the first and fourth holes. And in the step (E), the etching is carried out so that the dielectric layer and the first insulating layer are etched but the second insulating layer is not etched.

In one embodiment, the semiconductor layer is an oxide semiconductor layer.

In one embodiment, the oxide semiconductor layer may be an IGZO layer.

Advantageous Effects of Invention

According to an embodiment of the present invention, in a semiconductor device including a TFT, a first transparent conductive layer formed on the TFT, and a second transparent conductive layer formed over the first transparent conductive layer with a dielectric layer interposed between them, the size of a contact portion for connecting the drain electrode of the TFT to the second transparent conductive layer can be reduced. As a result, a semiconductor device of a higher definition is realized. Also, by arranging the contact portion so that the contact portion overlaps at least partially with the gate line layer when viewed along a normal to the substrate, the aperture ratio and transmittance can be increased. On top of that, by using an oxide semiconductor layer as the active layer of the TFT, the pixel capacitance be charged to a sufficiently high level quickly enough to check an increase in feedthrough voltage due to an increase in gate-drain capacitance (Cgd). According to an embodiment of the present invention, the feedthrough voltage is lowered by increasing $C_{CS}$, contrary to the teaching of Patent Document No. 3.

In addition, according to an embodiment of the present invention, such a semiconductor device can be fabricated efficiently without increasing the number of masks to use.

BRIEF DESCRIPTION OF DRAWINGS

FIGS. 2 (a) and (b) are respectively a plan view and a cross-sectional view illustrating a TFT 101 and contact portion 105 according to an embodiment of the present invention.

FIGS. 3 (a) and (b) are respectively a plan view and a cross-sectional view illustrating a portion of a COM-G connecting portion forming region 104R according to an embodiment of the present invention.

FIGS. 4 (a) and (b) are respectively a plan view and a cross-sectional view illustrating a portion of an S-G connecting portion forming region 103R according to an embodiment of the present invention.

FIGS. 5 (a) and (b) are respectively a plan view and a cross-sectional view illustrating a portion of a terminal portion forming region 102R according to an embodiment of the present invention.

FIG. 6 Shows the flow of the manufacturing process of the semiconductor device 100.

FIG. 7 Illustrates the process step of forming a TFT 101 and a contact portion 105 in a transistor forming region 101R, wherein portions (a1) through (a3) are cross-sectional views and portions (b1) through (b3) are plan views.

FIG. 9 Illustrates the process step of forming the TFT 101 and the contact portion 105 in the transistor forming region 101R, wherein portions (a7) and (a8) are cross-sectional views and portions (b7) and (b8) are plan views.

FIG. 11 Illustrates the process step of forming the terminal portion 102 in the terminal portion forming region 102R, wherein portions (a4) through (a6) are cross-sectional views and portions (b4) through (b6) are plan views.

FIG. 14 Illustrates the process step of forming the S-G connecting portion 103 in the S-G connecting portion forming region 103R, wherein portions (a4) through (a6) are cross-sectional views and portions (b4) through (b6) are plan views.

FIG. 15 Illustrates the process step of forming the S-G connecting portion 103 in the S-G connecting portion forming region 103R, wherein portions (a7) and (a8) are cross-sectional views and portions (b7) through (b8) are plan views.

FIGS. 19 (*a*) and (*b*) are respectively a cross-sectional view and a plan view illustrating a contact portion 105(2) according to a modified example.

FIG. 22 Plan views illustrating variations of the S-G connecting portion, wherein (a) and (b) illustrate S-G connecting portions 103(1) and 103(2), respectively.

DESCRIPTION OF EMBODIMENTS

Hereinafter, embodiments of a semiconductor device, display device and method for fabricating a semiconductor device according to the present invention will be described with reference to the accompanying drawings. It should be noted, however, that the present invention is in no way limited to the illustrative embodiments to be described below.

Embodiment 1

A first embodiment of a semiconductor device according to the present invention is a TFT substrate for use in an active-matrix-addressed liquid crystal display device. In the following description, a TFT substrate for use in an FFS mode display device will be described as an example. It should be noted that a semiconductor device according to this embodiment just needs to include a TFT and two transparent conductive layers on a substrate, and therefore, may also be implemented as a TFT substrate for use in a liquid crystal display device operating in any other mode or various kinds of display devices and electronic devices other than a liquid crystal display device.

Figure 1:
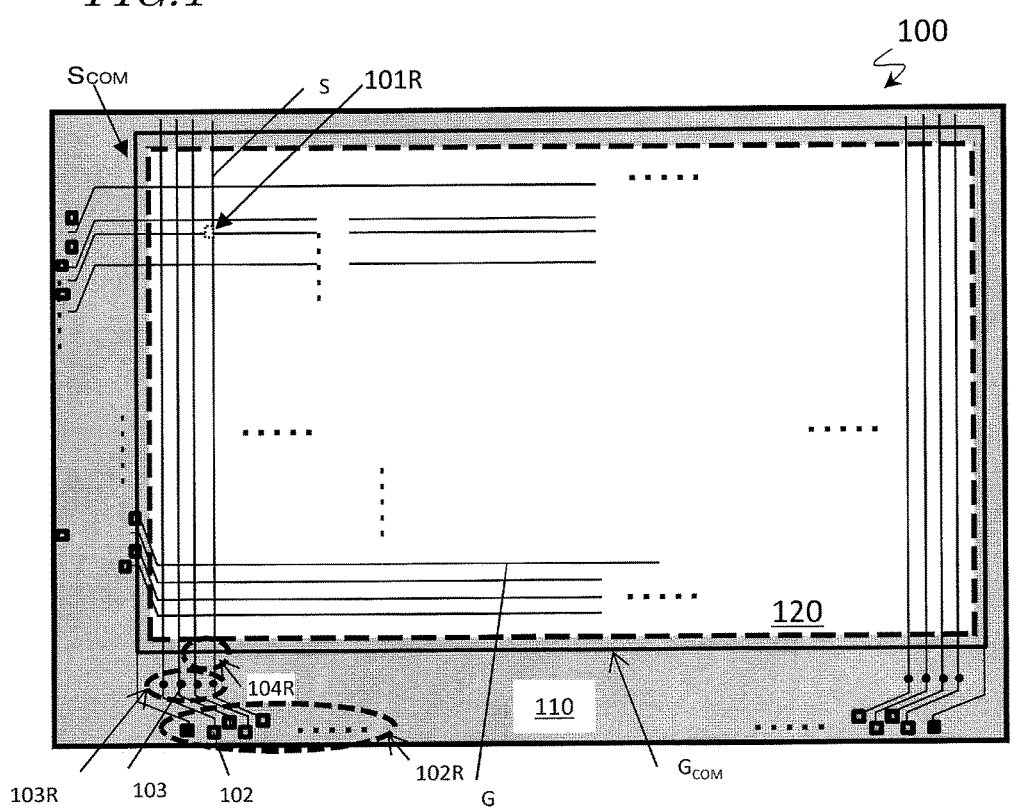
FIG. 1 Schematically illustrates an exemplary planar structure for a semiconductor device (TFT substrate) 100 according to an embodiment of the present invention.

FIG. 1 schematically illustrates an exemplary planar structure for a semiconductor device (TFT substrate) 100 according to this first embodiment. This semiconductor device 100 includes a display area (active area) 120 which contributes to a display operation and a peripheral area (frame area) 110 which is located outside of the display area 120.

In the display area 120, a plurality of gate lines G and a plurality of source lines S have been formed, and each region surrounded with these lines defines a "pixel". As shown in FIG. 1, those pixels are arranged in a matrix pattern. A pixel electrode (not shown) has been formed in each pixel. Although not shown, in each pixel, a thin-film transistor (TFT) has been formed as an active element in the vicinity of each intersection between the source lines S and the gate lines G. Each TFT is electrically connected to its associated pixel electrode via a contact portion. In this description, a region where a TFT and a contact portion are formed will be referred to herein as a "transistor forming region 101R". In addition, according to this embodiment, a common electrode (not shown) is arranged under each pixel electrode so as to face the pixel electrode with a dielectric layer (insulating layer) interposed between them. A common signal (which will be referred to herein as a "COM signal") is applied to the common electrode.

In the peripheral area 110, terminal portions 102, each of which electrically connects either a gate line G or a source line S to an external line, have been formed. Optionally, an S-G connecting portion 103 (i.e., a portion to change connections from a source line S to a gate line G) to be connected to a connector line which has been formed out of the same conductive film as the gate line G may be provided between each source line S and its associated terminal portion 102. In that case, the connector line is connected to the external line in the terminal portion 102. In this description, a region where a plurality of terminal portions 102 are formed will be referred to herein as a "terminal portion forming region 102R" and a region where the S-G connecting portion 103 is formed will be referred to herein as an "S-G connecting portion forming region 103R".

Also, in the example illustrated in FIG. 1, further formed in the peripheral area 110 are COM signal lines $S_{COM}$ and $G_{COM}$ to apply a COM signal to the common electrode, COM-G connecting portions (not shown) to connect the COM signal lines $G_{COM}$ to the common electrode, and COM-S connecting portions (not shown) to connect the COM signal lines $S_{COM}$ to the common electrode. Even though the COM signal lines $S_{COM}$ and $G_{COM}$ are arranged in this example in a ring pattern so as to surround the display area 120, the planar shapes of the COM signal lines $S_{COM}$ and $G_{COM}$ are not particularly limited.

In this example, the COM signal lines $S_{COM}$ which run parallel to the source lines 11 have been formed out of the same conductive film as the source lines 11, and the COM signal lines $G_{COM}$ which run parallel to the gate lines 3 have been formed out of the same conductive film as the gate lines 3. These COM signal lines $S_{COM}$ and $G_{COM}$ may be electrically connected together in the vicinity of the respective corners of the display area 120 in the peripheral area 110, for example. It should be noted that the conductive film to make the COM signal lines does not have to be the one described above. Optionally, the entire COM signal lines may have been formed out of the same conductive film as either the gate lines 3 or the source lines 11.

Each COM-G connecting portion to connect the COM signal line $G_{COM}$ to the common electrode may be arranged between adjacent source lines S so as not to overlap with the S-G connecting portion 103 in the peripheral area 110. In this description, the region where the COM-G connecting portion is formed will be referred to herein as a "COM-G connecting portion forming region 104R".

Although not shown in FIG. 1, COM-S connecting portions to connect the COM signal lines $S_{COM}$ to the common electrode may be arranged in the peripheral area 110.

Depending on the mode of operation of the display device to which this semiconductor device 100 is applied, the counter electrode does not have to be a common electrode. In that case, the COM signal lines and COM-G connecting portions do not have to be provided in the peripheral area 110. Also, if this semiconductor device 100 is applied to a display device to operate in the longitudinal electric field driving mode, for example, the transparent conductive layer which is arranged to face the pixel electrodes with a dielectric layer interposed between them does not have to function as an electrode.

<Transistor Forming Region 101R>

The semiconductor device 100 of this embodiment includes a TFT 101 and a contact portion 105 to connect the TFT 101 to its associated pixel electrode in each pixel. In this embodiment, the contact portion 105 is also arranged in the transistor forming region 101R.

FIGS. 2(*a*) and 2(*b*) are respectively a plan view and a cross-sectional view illustrating a TFT 101 and contact portion 105 according to this embodiment. Even though a surface which is tilted with respect to the substrate 1 (such as a tapered portion) is indicated by stepped lines in the cross-sectional view shown in FIG. 2(*b*), actually the surface is a smooth sloped surface. The same can be said about each of the other cross-sectional views attached to the present application.

In the transistor forming region 101R, there are a TFT 101, an insulating layer 14 which covers the TFT 101, a first transparent conductive layer 15 which is arranged on the insulating layer 14, and a second transparent conductive layer 19*a* which is arranged over the first transparent conductive layer with a dielectric layer (insulating layer) 17 interposed between them. In this description, the insulating layer 14 which has been formed between the first transparent conductive layer 15 and the TFT 101 will be referred to herein as an "interlevel insulating layer", and an insulating layer which has been formed between the first and second transparent conductive layers 15 and 19*a* and which forms capacitance with these conductive layers 15 and 19*a* will be referred to herein as a "dielectric layer". In this embodiment, the interlevel insulating layer 14 includes a first insulating layer 12 which has been formed in contact with the drain electrode of the TFT 101 and a second insulating layer 13 which has been formed on the first insulating layer 12.

The TFT 101 includes a gate electrode 3*a*, a gate insulating layer 5 which has been formed on the gate electrode 3*a*, a semiconductor layer 7*a* which has been formed on the gate insulating layer 5, and source and drain electrodes 11*s* and 11*d* which have been formed in contact with the semiconductor layer 7*a*. When viewed along a normal to the substrate 1, at least a portion of the semiconductor layer 7*a* to be a channel region is arranged so as to overlap with the gate electrode 3*a* with the gate insulating layer 5 interposed between them.

The gate electrode 3*a* has been formed out of the same conductive film as the gate line 3 so that the gate electrode 3*a* and the gate line 3 form parts of the same layer. In this description, such a layer which has been formed out of the same conductive film as the gate line 3 will be collectively referred to herein as a "gate line layer". Thus, the gate line layer includes the gate line 3 and the gate electrode 3*a*. The gate line 3 includes a portion which functions as the gate of the TFT 101 and which will be the gate electrode 3*a* described above. Also, in this description, a pattern of which the gate electrode 3*a* and the gate line 3 form integral parts will be sometimes referred to herein as a "gate line 3". When viewed along a normal to the substrate 1, the gate line 3 includes a portion which runs in a predetermined direction and an extended portion which is extended from that portion to run in a different direction from the predetermined one. And that extended portion may function as the gate electrode 3*a*. Or when viewed along a normal to the substrate 1, the gate line 3 may have a plurality of linear portions which have a constant width and which run in a predetermined direction and some of those linear portions may overlap with the channel region of the TFT 101 and function as the gate electrode 3*a*.

The source and drain electrodes 11*s* and 11*d* have been formed out of the same conductive film as the source line 11. In this description, such a layer which has been formed out of the same conductive film as the source line 11 will be collectively referred to herein as a "source line layer". Thus, the source line layer includes the source line 11 and the source and drain electrodes 11*s* and 11*d*. The source electrode 11*s* is electrically connected to the source line 11. In this embodiment, the source electrode 11*s* and the source line 11 form integral parts of the same layer. The source line 11 may include a portion which runs in a predetermined direction and an extended portion which is extended from that portion to run in a different direction from the predetermined one. And that extended portion may function as the source electrode 11*s*.

The interlevel insulating layer 14 and the dielectric layer 17 have a contact hole CH1 which reaches the surface of (i.e., which exposes) the drain electrode 11*d* of the TFT 101. The drain electrode 11*d* and the second transparent conductive layer 19*a* contact with each other in the contact hole CH1, thereby forming a contact portion 105. In this description, the "contact portion 105" does not refer to the entire contact hole but means only a portion where the drain electrode 11*d* of the TFT 101 contacts with the second transparent conductive layer 19*a*.

As shown in FIG. 2(*b*), the gate insulating layer 5 may have a multilayer structure comprised of a first gate insulating layer 5A and a second gate insulating layer 5B which has been stacked on the first gate insulating layer 5A. Optionally, a protective layer 9 may be formed so as to cover at least a portion of the semiconductor layer 7*a* to be a channel region. The source and drain electrodes 11*s* and 11*d* may contact with the semiconductor layer 7a in respective holes which have been cut through the protective layer 9.

Of the interlevel insulating layer 14, the first insulating layer 12 which is arranged closer to the TFT 101 may be an inorganic insulating layer, for example, and has been formed so as to contact with a portion of the drain electrode 11d. The insulating layer 12 functions as a passivation layer. The second insulating layer 13 which has been formed on the first insulating layer 12 may be an organic insulating film. Although the interlevel insulating layer 14 has a double layer structure in the example illustrated in FIG. 2(b), the interlevel insulating layer 14 may also have a single layer structure consisting of only the first insulating layer 12 or may even have a multilayer structure consisting of three or more layers.

The first transparent conductive layer 15 may function as a common electrode, for example, and has a hole 15p. When viewed along a normal to the substrate 1, the contact hole CH1 is located inside of the hole 15p. The side surface of the first transparent conductive layer 15 which is located closer to the hole 15p is covered with the dielectric layer 17 and not exposed on the sidewall of the contact hole CH1. In this example, the first transparent conductive layer 15 covers each pixel almost entirely. The outer edges of the first transparent conductive layer 15 may be substantially aligned with the outer edges of each pixel (i.e., the edges of an area of each pixel through which visible radiation is transmitted). In each pixel, the first transparent conductive layer 15 suitably has no hole but the hole to define the contact portion 105.

The second transparent conductive layer 19a may function as a pixel electrode, for example, and has been divided into multiple portions for respective pixels in this example. Also, the second transparent conductive layer 19a has a plurality of slit holes.

The second transparent conductive layer 19a is arranged so as to overlap at least partially with the first transparent conductive layer 15 with the dielectric layer 17 interposed between them when viewed along a normal to the substrate 1. That is why capacitance is produced in that overlapping portion between those two conductive layers 15 and 19a. The capacitance can function as a storage capacitor for a display device. The second transparent conductive layer 19a contacts with the drain electrode 11d of the TFT 101 in the contact portion 105 in the contact hole CH1.

The contact portion 105 is arranged so as to overlap at least partially with the gate line layer (i.e., either the gate line 3 or the gate electrode 3a in this case) when viewed along a normal to the substrate 1.

Hereinafter, the shapes of the contact portion 105 and contact hole CH1 will be described with reference to FIG. 2(a), in which exemplary outer edges of the respective holes of the first transparent conductive layer 15, dielectric layer 17 and second insulating layer 13 are indicated by the lines 15p, 17p and 13p, respectively.

In this description, if the side surface of a hole that has been cut through the respective layers is not perpendicular to the substrate 1 but if the size of the hole changes with the depth (e.g., if the hole has a tapered shape), the outer edge of the hole at a depth at which the hole has the smallest size will be referred to herein as the "outer edge of the hole". That is why in FIG. 2(a), the outer edge of the hole 13p of the second insulating layer 13, for example, is the outer edge at the bottom of the second insulating layer 13 (i.e., at the interface between the second and first insulating layers 13 and 12).

Both of the holes 17p and 13p are located inside of the hole 15p of the first transparent conductive layer 15. That is why the first transparent conductive layer 15 is not exposed on the sidewall of the contact hole CH1 and only the second transparent conductive layer 19a and the drain electrode 11d are electrically connected together in the contact portion 105. These holes 17p and 13p are arranged so as to at least partially overlap with each other. And that overlapping portion between these holes 17p and 13p corresponds to the hole 12p of the first insulating layer 12 which contacts with the drain electrode 11d. In this embodiment, the holes 17p and 13p are arranged so that at least part of the outer edge of the hole 17p of the dielectric layer 17 is located inside of the outer edge of the hole 13p of the second insulating layer 13. In the example illustrated in FIG. 2(a), the respective holes 17p and 13p of the dielectric layer 17 and second insulating layer 13 partially overlap with each other, and a part of the left side of the outer edge of the hole 17p is located inside of the outer edge of the hole 13p.

As will be described later, the contact hole CH1 is cut by etching the dielectric layer 17 and the first insulating layer 12 at the same time. That is why the side surface of the first insulating layer 12 that is located closer to the hole 12p (which will be sometimes referred to herein as the "hole's side surface") needs to be aligned at least partially with the side surface of the dielectric layer 17 that is located closer to the hole 17p (i.e., the sidewall on the left-hand side of the contact hole CH1 shown in FIG. 2(b)). In this description, if two or more different layers "have their side surfaces aligned with each other", the side surfaces of those layers may not only be vertically aligned with each other but also define a continuous sloped surface such as a tapered surface. Such a configuration can be obtained by etching those layers through the same mask, for example.

The dielectric layer 17 and the first insulating layer 12 may be etched under such a condition that the other constituent layer of the interlevel insulating layer 14 (i.e., the second insulating layer 13 in this case) will not be etched. For example, if an organic insulating film is used as the second insulating layer 13, a hole 13p may be cut through the second insulating layer 13 and then the dielectric layer 17 and the first insulating layer 12 may be etched using the second insulating layer 13 as an etching mask. As a result, a part of the side surface of the first insulating layer 12 closer to the hole 12p gets aligned with the side surface of the second insulating layer 13 closer to the hole 13p (i.e., the sidewall on the right-hand side of the contact hole CH1 shown in FIG. 2(b)). As will be described later, depending on the relative arrangement of the respective holes 13p and 17p of the second insulating layer 13 and dielectric layer 17, the entire side surface of the hole 12p of the first insulating layer 12 may be aligned with either the side surface of the hole 17p of the dielectric layer 17 or the side surface of the hole 13p of the second insulating layer 13.

Such a contact portion 105 may be formed in the following manner, for example. First of all, a TFT 101 is fabricated on the substrate 1. Next, a first insulating layer 12 which contacts with at least the drain electrode 11d of the TFT 101 is formed so as to cover the TFT 101. Subsequently, a first transparent conductive layer 15 with a hole 15p is formed over the first insulating layer 12. Thereafter, a dielectric layer 17 is deposited on the first transparent conductive layer 15 and inside the hole 15p. Then, the dielectric layer 17 and the first insulating layer 12 are etched simultaneously inside the hole 15p, thereby cutting a contact hole CH1 and exposing the surface of the drain electrode 11d. Next, a second transparent conductive layer 19a is formed on the dielectric layer 17 and inside the contact hole CH1 so as to contact with the surface of the drain electrode 11d. Optionally, after the first insulating layer 12 has been formed and before the first transparent conductive layer 15 is formed, a second insulating layer 13 may be formed out of an organic insulating film, for example, as in the example illustrated in FIG. 2(b). This process step of forming the contact portion 105 will be described in further detail later.

Since the contact portion 105 of this embodiment has such a configuration, the following advantages can be achieved according to this embodiment.

(1) Size of the Contact Portion 105 can be Reduced

According to a conventional configuration (such as the configuration disclosed in Patent Document No. 2), a contact portion to connect a drain electrode and a common electrode together and another contact portion to connect the common electrode and a pixel electrode together need to be formed separately, and therefore, the chip area that should be allocated to the contact portions cannot be reduced, which is a problem. In addition, if the drain electrode should be connected to the pixel electrode via the common electrode within a single contact hole, two transparent conductive layers should be stacked inside that contact hole, thus increasing the area that should be allocated to the contact hole.

On the other hand, according to this embodiment, the first transparent conductive layer 15 is not exposed inside the contact hole CH1 and the second transparent conductive layer 19a can directly contact with the drain electrode 11d inside the contact hole CH1. As a result, respective components can be laid out more efficiently, and the sizes of the contact hole CH1 and the contact portion 105 can be reduced compared to the conventional configuration. Consequently, a TFT substrate of a higher definition is realized.

(2) Transmittance can be Increased by Arranging Contact Portion 105

Figure 12:
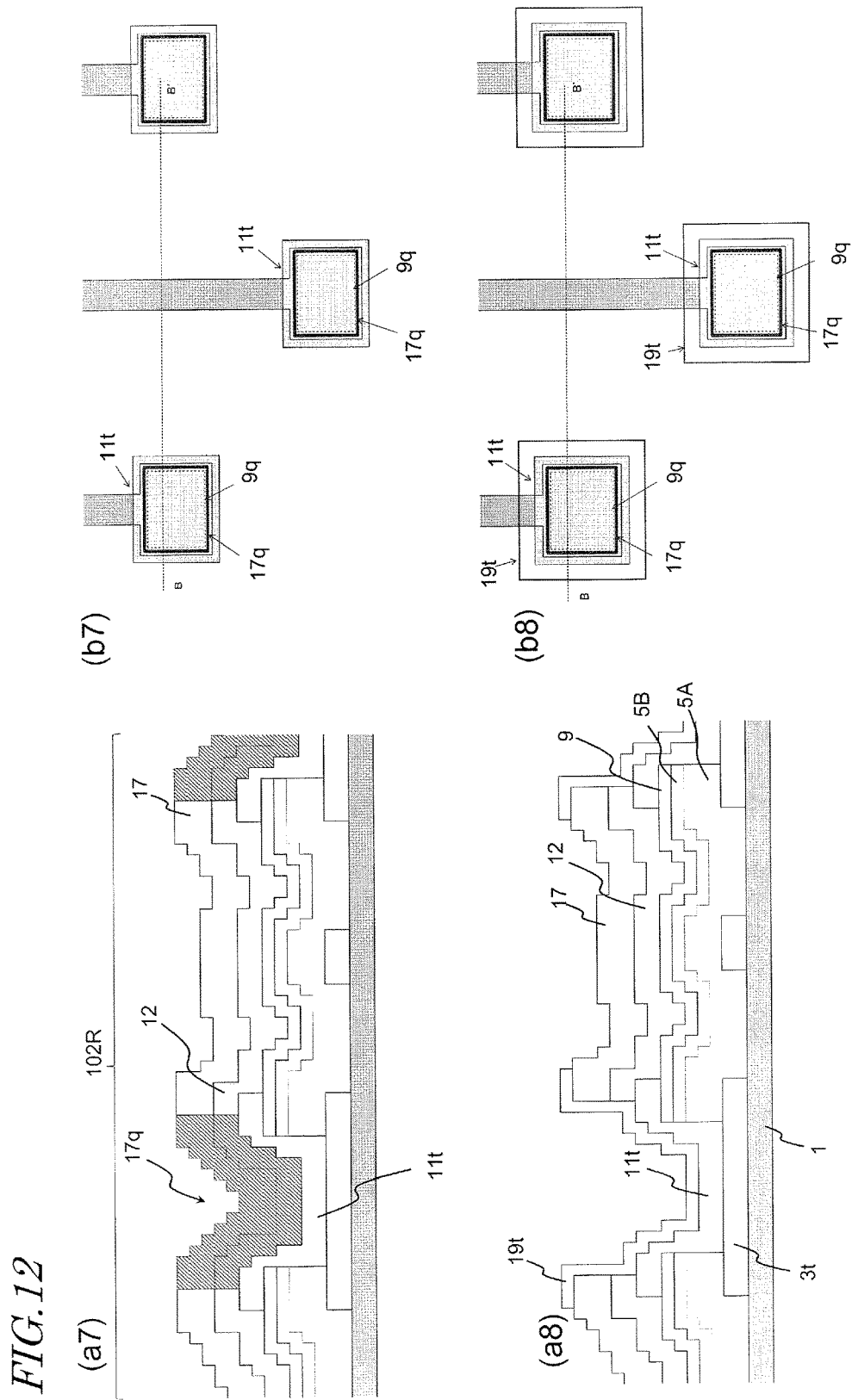
FIG. 12 Illustrates the process step of forming the terminal portion 102 in the terminal portion forming region 102R, wherein portions (a7) and (a8) are cross-sectional views and portions (b7) through (b8) are plan views.

According to the structures disclosed in Patent Documents Nos. 1 to 3, when viewed along a normal to the substrate, the contact portion to connect the drain electrode and the pixel electrode together is arranged in a region which transmits light inside the pixel and does not overlap with the gate line (see FIG. 12 of Patent Document No. 1, FIG. 1 of Patent Document No. 2, and FIG. 5 of Patent Document No. 3, for example). As a result, due to the presence of such a contact portion, the aperture ratio (transmittance) of the pixel decreases.

On the other hand, according to this embodiment, when viewed along a normal to the substrate 1, the contact portion 105 to connect the drain electrode 11d of the TFT 101 and the second transparent conductive layer 19a together is arranged to overlap with the gate line layer (such as the gate line 3 or the gate electrode 3a). As a result, the decrease in aperture ratio due to the presence of the contact portion 105 can be checked and the transmittance can be increased compared to the conventional configuration, and a TFT substrate of higher definition can be obtained. Optionally, the contact portion 105 may not overlap with the gate line 3. Even so, if at least a portion of the contact portion 105 overlaps with another portion that forms part of the gate line layer, such effects can still be achieved. Nevertheless, the contact portion 105 is suitably arranged to overlap with either the gate line 3 or the gate electrode 3a, and more suitably arranged to overlap with a linear portion of the gate line 3 which runs in a predetermined direction.

As described for the effect (1), according to this embodiment, the area of the contact portion 105 can be reduced, and therefore, the entire contact portion 105 can be arranged to overlap with the gate line 3 without increasing the width of the gate line 3. As a result, the transmittance can be increased more effectively, and the definition can be further increased.

Furthermore, in a region where the contact portion 105 is going to be formed, the width of the drain electrode 11d is suitably set to be sufficiently smaller than the width of the gate line 3 and the entire drain electrode 11d is suitably arranged so as to overlap with the gate line 3. For example, in the plan view shown in FIG. 2(a), the patterns of the gate electrode 3a and drain electrode 11d may be set so that the distance between the respective edges of the gate electrode 3a and drain electrode 11d becomes equal to or greater than 2 μm. As a result, the decrease in transmittance due to the presence of the drain electrode 11d can be checked. In addition, since the variation in Cgd due to misalignment can be minimized, the reliability of the liquid crystal display device can be increased.

(3) Surface Protection for Drain Electrode 11d

As described above, according to this embodiment, the contact portion 105 is formed inside the hole 15p of the first transparent conductive layer 15. That is why the manufacturing process can be advanced to the process step of forming the dielectric layer 17 with the surface of the drain electrode 11d covered with the first insulating layer 12, and just before the second transparent conductive layer 19a is formed, the drain electrode 11d may get exposed by etching the dielectric layer 17 and the first insulating layer 12 simultaneously, as described above. If such a process is adopted, there is no need to perform multiple process steps with the drain electrode 11d exposed, and the process induced damage to be done on the surface of the drain electrode 11d can be minimized. As a result, a stabilized contact portion 105 with even lower resistance can be formed.

(4) Transmittance can be Increased by Transparent Storage Capacitor

According to this embodiment, the second transparent conductive layer 19a is arranged so as to overlap at least partially with the first transparent conductive layer 15 with the dielectric layer 17 interposed between them, thereby producing capacitance. This capacitance functions as a storage capacitor. By appropriately adjusting the material and thickness of the dielectric layer 17 and the area of a portion to produce the capacitance, a storage capacitor with any intended capacitance can be obtained. That is why there is no need to form a storage capacitor separately inside a pixel using the same metal film as the source line, for example. As a result, the decrease in aperture ratio due to the presence of a storage capacitor using a metal film can be checked.

In this embodiment, the semiconductor layer 7a to be used as the active layer of the TFT 101 is not particularly limited, but is suitably an oxide semiconductor layer such as an In—Ga—Zn—O based amorphous oxide semiconductor layer (i.e., an IGZO layer). Since an oxide semiconductor has higher mobility than an amorphous silicon semiconductor, the size of the TFT 101 can be reduced. On top of that, if an oxide semiconductor TFT is applied to the semiconductor device of this embodiment, the following advantages can also be achieved.

According to this embodiment, the contact portion 105 is arranged so as to overlap with the gate line layer (e.g., the gate line 3 in this example), thereby increasing the aperture ratio of each pixel. That is why Cgd increases compared to the conventional configuration. The semiconductor device is ordinarily designed so that the ratio of Cgd to the pixel capacitance $Cgd/[Cgd+(C_{LC}+C_{CS})]$ is less than a predetermined value. For that reason, as Cgd increases, the pixel capacitance ($C_{LC}+C_{CS}$) should also be increased accordingly. However, even if the pixel capacitance can be increased, an amorphous silicon TFT could not write at a conventional frame frequency. As can be seen, for a conventional semiconductor device using an amorphous silicon TFT, it is not practical to adopt a configuration in which the contact portion is arranged to overlap with the gate line, and such a configuration has never been adopted, because other characteristics that a display device needs to have would not be satisfied with such a configuration.

On the other hand, according to this embodiment, $C_{CS}$ is increased by using a storage capacitor which is formed by the first and second transparent conductive layers 15 and 19a and dielectric layer 17 described above. Since both of these conductive layers 15 and 19a are transparent, the transmittance would not decrease even if such a storage capacitor is formed. Consequently, the pixel capacitance can be increased and the ratio of Cgd to the pixel capacitance can be reduced to a sufficiently low level. Furthermore, by applying an oxide semiconductor TFT to this embodiment, even if the pixel capacitance increases, the mobility of the oxide semiconductor is so high that a write operation can be performed at as high a frame frequency as a conventional one. As a result, the aperture ratio can be increased to a degree corresponding to the area of the contact portion 105 with a sufficiently high writing speed maintained and with $Cgd/[Cgd+(C_{LC}+C_{CS})]$ reduced to a sufficiently low level.

If the semiconductor device 100 of this embodiment is applied to an FFS mode display device, then the second transparent conductive layer 19a is divided into multiple portions for respective pixels, which function as pixel electrodes. Each of those portions (pixel electrodes) of the second transparent conductive layer 19a suitably has a plurality of slit holes. On the other hand, as long as the first transparent conductive layer 15 is arranged under the slit holes of the pixel electrodes to say the least, the first transparent conductive layer 15 functions as a counter electrode for the pixel electrodes and can apply a lateral electric field to liquid crystal molecules. The first transparent conductive layer 15 is suitably formed so as to cover almost entirely a portion of each pixel which is not hidden behind a metal film such as the gate line 3 or the source line 11 and which transmits the incoming light. In this embodiment, the first transparent conductive layer 15 covers almost the entire pixel (except the hole 15p to define the contact portion 105). As a result, a portion of the first transparent conductive layer 15 which overlaps with the second transparent conductive layer 19a can be increased, and therefore, the area of the storage capacitor can be increased. In addition, if the first transparent conductive layer 15 covers almost the entire pixel, an electric field coming from an electrode (or line) which is located under the first transparent conductive layer 15 can be cut off by the first transparent conductive layer 15, which is also advantageous. 80% or more of each pixel is suitably covered with the first transparent conductive layer 15, for example.

The semiconductor device 100 of this embodiment is applicable to a display device which operates in any mode other than the FFS mode. For example, to apply the semiconductor device 100 of this embodiment to a longitudinal electric field driven display device such as a VA mode display device so that the second transparent conductive layer 19a functions as a pixel electrode and that a transparent storage capacitor is formed in each pixel, the dielectric layer 17 and the first transparent conductive layer 15 may be formed between the pixel electrodes and the TFTs 101.

<COM-G Connecting Portion Forming Region 104R>

FIGS. 3(a) and 3(b) are respectively a plan view and a cross-sectional view illustrating a portion of a COM-G connecting portion forming region 104R according to this embodiment.

In each COM-G connecting portion 104 to be formed in the COM-G connecting portion forming region 104R, a lower conductive layer 3cg and a lower transparent connecting layer 15cg which has been formed out of the same conductive film as the first transparent conductive layer 15 that is a common electrode, for example, are connected together via an upper transparent connecting layer 19cg. The lower conductive layer 3cg may be formed out of the same conductive film as the gate line 3 which forms part of the gate line layer. The upper transparent connecting layer 19cg may be formed out of the same conductive film as the second transparent conductive layer 19a which functions as pixel electrodes, for example.

Its specific structure will be described. The COM-G connecting portion 104 includes a Pix-G connecting portion which connects the lower conductive layer 3cg and the upper transparent connecting layer 19cg together and a COM-Pix connecting portion which connects the upper and lower transparent connecting layers 19cg and 15cg together.

The COM-G connecting portion 104 includes: the lower conductive layer 3cg which has been formed on the substrate 1; the gate insulating layer 5 and protective layer 9 which have been extended so as to cover the lower conductive layer 3cg; an upper conductive layer 11cg which contacts with the lower conductive layer 3cg inside a hole 9u that has been cut through the gate insulating layer 5 and protective layer 9; the interlevel insulating layer 14 and dielectric layer 17 which have been extended so as to cover the upper conductive layer 11cg; a lower transparent connecting layer 15cg which has been formed between the interlevel insulating layer 14 and the dielectric layer 17 out of the same transparent conductive film as the first transparent conductive layer; and an upper transparent connecting layer 19cg which has been formed on the dielectric layer 17 out of the same transparent conductive film as the second transparent conductive layer 19a. The upper transparent connecting layer 19cg contacts with the upper conductive layer 11cg inside a contact hole cH2 which has been cut through the interlevel insulating layer 14 and dielectric layer 17 (Pix-G connecting portion). In the region where the Pix-G connecting portion will be formed, there is no lower transparent connecting layer 15cg. Also, the upper transparent connecting layer 19cg contacts with the lower transparent connecting layer 15cg inside a hole (contact hole) 17v which has been cut through the dielectric layer 17 (COM-Pix connecting portion).

As can be seen, in the COM-G connecting portion 104, the upper conductive layer 11cg and lower transparent connecting layer 15cg do not directly contact with each other, but are connected together via the upper transparent connecting layer 19cg. As a result, even if the TFT 101 is formed by carrying out a process in which the first insulating layer 12 and dielectric layer 17 are etched simultaneously as described above, electrical connection can be ensured between the lower conductive layer 3cg and the lower transparent connecting layer 15cg. According to this configuration, the area required by the COM-G connecting portion 104 increases by the area of the COM-Pix connecting portion compared to a configuration in which the lower conductive layer 3cg and lower transparent connecting layer 15cg directly contact with each other.

In this embodiment, the lower transparent connecting layer 15cg is connected to the first transparent conductive layer 15 that functions as a common electrode. For example, the lower transparent connecting layer 15cg and the first transparent conductive layer 15 have been formed as respective parts of the same layer. The lower conductive layer 3cg may either form part of, or may be connected to, the COM signal line $G_{COM}$ (see FIG. 1). Thus, the first transparent conductive layer 15 is electrically connected to the COM signal line $G_{COM}$ via the COM-G connecting portion 104. It should be noted that the COM signal line $G_{COM}$ is connected to an external line via the terminal portion 102 so that a predetermined COM signal is input to the COM signal line $G_{COM}$ from an external device.

The hole 9u may be cut through the gate insulating layer 5 and the protective layer 9 by etching the gate insulating layer 5 and the protective layer 9 simultaneously. In that case, the respective side surfaces of the gate insulating layer 5 and protective layer 9 closer to the hole 9u will be aligned with each other. Also, on the periphery of the hole 9u, these insulating layers 5 and 9 are suitably present between the lower and upper conductive layers 3cg and 11cg. Even though the upper conductive layer 11cg is arranged so as to contact with the upper and end surfaces of the lower conductive layer 3cg in the example illustrated in FIG. 3, the upper conductive layer 11cg may contact with only the upper surface of the lower conductive layer 3cg as will be described later.

Just like the contact hole CH1 to define the contact portion 105 described above, the contact hole CH2 may also be cut by etching the dielectric layer 17 and the first insulating layer 12 at a time. The respective shapes and arrangements of the holes 17u, 13u and 12u of the dielectric layer 17, second insulating layer 13 and first insulating layer 12 may be the same as those of the holes that have been cut through the respective layers of the contact portion 105. For example, at least a part of the outer edge of the hole 17u is located inside of the hole 13u. As a result, on the sidewall of the contact hole CH2, the side surface of the hole 12u of the first insulating layer 12 is aligned at least partially with the side surface of the hole 17u of the dielectric layer 17.

<S-G Connecting Portion Forming Region 103R>

FIGS. 4(a) and 4(b) are respectively a plan view and a cross-sectional view illustrating a portion of an S-G connecting portion forming region 103R according to this embodiment.

Each S-G connecting portion 103 to be formed in the S-G connecting portion forming region 103R includes: a lower conductive layer 3sg which has been formed on the substrate 1; the gate insulating layer 5 and protective layer 9 which have been extended so as to cover the lower conductive layer 3sg; an upper conductive layer 11sg which contacts with the lower conductive layer 3sg inside a hole 9r that has been cut through these insulating layers 5 and 9; and the interlevel insulating layer 12, 13 and dielectric layer 17 which have been extended so as to cover the upper conductive layer 11sg.

The S-G connecting portion 103 of this embodiment has a structure in which the lower and upper conductive layers 3sg and 11sg are directly in contact with each other. That is why compared to a structure in which the lower and upper conductive layers 3sg and 11sg are connected together via another conductive layer such as a transparent conductive film for use in the pixel electrode, an S-G connecting portion 103 of a smaller size and with lower resistance can be formed.

The lower conductive layer 3sg has been formed out of the same conductive film as the gate line 3, for example. The upper conductive layer 11sg has been formed out of the same conductive film as the source line 11, for example. In other words, the gate line layer includes the lower conductive layer 3sg and the source line layer includes the upper conductive layer 11sg. In this embodiment, the upper conductive layer 11sg is connected to the source line 11 and the lower conductive layer 3sg is connected to the lower conductive layer 3t of the terminal portion (i.e., source terminal portion) 102. As a result, the source line 11 can be connected to the terminal portion 102 via the S-G connecting portion 103.

The hole 9r may be cut through the gate insulating layer 5 and the protective layer 9 by etching the gate insulating layer 5 and the protective layer 9 simultaneously. In that case, the respective side surfaces of the gate insulating layer 5 and protective layer 9 closer to the hole 9r will be aligned with each other.

In the S-G connecting portion 103, on the periphery of the hole 9r, insulating layers (e.g., the gate insulating layer 5 and the protective layer 9 in this case) are suitably present between the lower and upper conductive layers 3sg and 11sg. Even though the upper conductive layer 11sg is arranged so as to contact with the upper and end surfaces of the lower conductive layer 3sg in the example illustrated in FIG. 4, the upper conductive layer 11sg may contact with only the upper surface of the lower conductive layer 3sg as will be described later.

With the S-G connecting portion 103 of this embodiment, the two metals (i.e., the lower and upper conductive layers 3sg and 11sg) can be brought into direct contact with each other. That is why compared to a situation where those metals are connected together with a transparent conductive film, for example, the resistance of the S-G connecting portion 103 can be reduced. In addition, since the size of the S-G connecting portion 103 can be reduced, this S-G connecting portion 103 contributes to further increasing the definition.

<Terminal Portion Forming Region 102R>

FIGS. 5(a) and 5(b) are respectively a plan view and a cross-sectional view illustrating a portion of a terminal portion forming region 102R according to this embodiment.

Each terminal portion 102 to be formed in the terminal portion forming region 102R includes: a lower conductive layer 3t which has been formed on the substrate 1; the gate insulating layer 5 and protective layer 9 which have been extended so as to cover the lower conductive layer 3t; an upper conductive layer 11t which contacts with the lower conductive layer 3t inside a hole 9q that has been cut through the gate insulating layer 5 and protective layer 9; the first insulating layer 12 and dielectric layer 17 which have been extended so as to cover the upper conductive layer 11t; and an external connecting layer 19t which contacts with the upper conductive layer 11t inside the hole 17q that has been cut through the first insulating layer 12 and dielectric layer 17. In the terminal portion 102, electrical connection between the external connecting layer 19t and the lower conductive layer 3t is ensured via the upper conductive layer 11t.

In the example illustrated in FIG. 5, the lower conductive layer 3t has been formed out of the same conductive film as the gate line 3, for example. The lower conductive layer 3t may be connected to either the gate line 3 (in a gate terminal portion) or the source line 11 via the S-G connecting portion (in a source terminal portion). The upper conductive layer 11t has been formed out of the same conductive film as the source line 11, for example. The external connecting layer 19t may be formed out of the same conductive film as the second transparent conductive layer 19.

The hole 9q may be cut through the gate insulating layer 5 and the protective layer 9 by etching the gate insulating layer 5 and the protective layer 9 simultaneously. In that case, the respective side surfaces of the gate insulating layer 5 and protective layer 9 closer to the hole 9q will be aligned with each other.

The hole 17q may be cut through the first insulating layer 12 and the dielectric layer 17 by etching the dielectric layer 17 and the first insulating layer 12 simultaneously. In that case, the respective side surfaces of the dielectric layer 17 and first insulating layer 12 closer to the hole 17q will be aligned with each other.

In the terminal portion 102, on the periphery of the hole 9q, insulating layers (e.g., the gate insulating layer 5 and the protective layer 9 in this case) are suitably present between the lower and upper conductive layers 3t and 11t. In the same way, on the periphery of the hole 13q, insulating layers (e.g., the first insulating layer 12 and the dielectric layer 17 in this case) are suitably present between the upper conductive layer 11t and the external connecting layer 19t. By adopting such a configuration, a redundant structure is realized, and therefore, a highly reliable terminal portion 102 can be provided.

<Configuration for Liquid Crystal Display Device>

Figure 24:
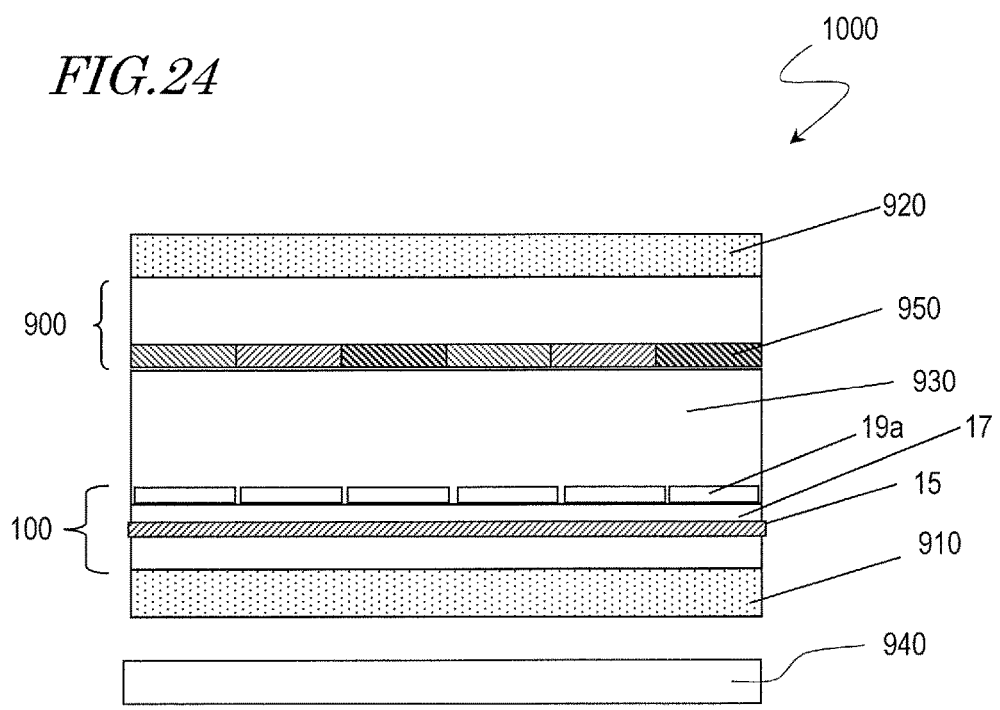
FIG. 24 A schematic cross-sectional view illustrating an exemplary liquid crystal display device 1000 according to an embodiment of the present invention.

Hereinafter, a configuration for a liquid crystal display device that uses the semiconductor device 100 of this embodiment will be described. FIG. 24 is a schematic cross-sectional view illustrating an exemplary liquid crystal display device 1000 according to this embodiment.

As shown in FIG. 24, this liquid crystal display device 1000 includes a TFT substrate 100 (corresponding to the semiconductor device 100 of the first embodiment) and a counter substrate 900 which face each other with a liquid crystal layer 930 interposed between them, two polarizers 910 and 920 which are arranged outside of the TFT substrate 100 and counter substrate 900, respectively, and a backlight unit 940 which emits light for display purposes toward the TFT substrate 100. In the TFT substrate 100, the second transparent conductive layer 19a has been divided into multiple portions, which are provided for respective pixels and function as pixel electrodes. A slit (not shown) has been cut through each of those pixel electrodes. The first transparent conductive layer 15 is present at least under the slits of the pixel electrodes with the dielectric layer 17 interposed between them, and functions as a common electrode.

Although not shown, in the peripheral area of the TFT substrate 100, arranged are a scan line driver to drive a plurality of scan lines (gate bus lines) and a signal line driver to drive a plurality of signal lines (data bus lines). The scan line driver and the signal line driver are connected to a controller which is arranged outside of the TFT substrate 100. Under the control by the controller, scan signals to turn ON and OFF the TFTs are supplied from the scan line driver to those scan lines and display signals (i.e., voltages applied to the second transparent conductive layer 19a that are pixel electrodes) are supplied from the signal line driver to those signal lines. Also, as already described with reference to FIG. 1, a COM signal is supplied through a COM signal line to the first transparent conductive layer 15 that is a common electrode.

The counter substrate 900 includes color filters 950, which include R (red), G (green) and B (blue) filters that are arranged for respective pixels when a display operation is supposed to be conducted in the three primary colors.

This liquid crystal display device 1000 conducts a display operation by inducing alignments of liquid crystal molecules in the liquid crystal layer 930 on a pixel-by-pixel basis in response to a potential difference between the first transparent conductive layer 15 that functions as the common electrode of the TFT substrate 100 and the second transparent conductive layer 19a that functions as pixel electrodes.

<Method for Fabricating Semiconductor Device 100>

Hereinafter, an exemplary method for fabricating the semiconductor device 100 of this embodiment will be described with reference to the accompanying drawings.

In the example to be described below, it will be described how to make the TFTs 101, contact portions 105, terminal portions 102, S-G connecting portions 103 and COM-G connecting portions 104, of which the configurations have already been described with reference to FIGS. 2 through 5, on the substrate 1 simultaneously. It should be noted that the manufacturing process of this embodiment is not limited to the exemplary one to be described below. Also, the respective configurations of the TFTs 101, contact portions 105, terminal portions 102, S-G connecting portions 103 and COM-G connecting portions 104 are appropriately changeable, too.

FIG. 6 shows the flow of the manufacturing process of the semiconductor device 100 of this embodiment. In this example, a mask is used in each of STEPS 1 through 8, and eight masks are used in total.

Figure 8:
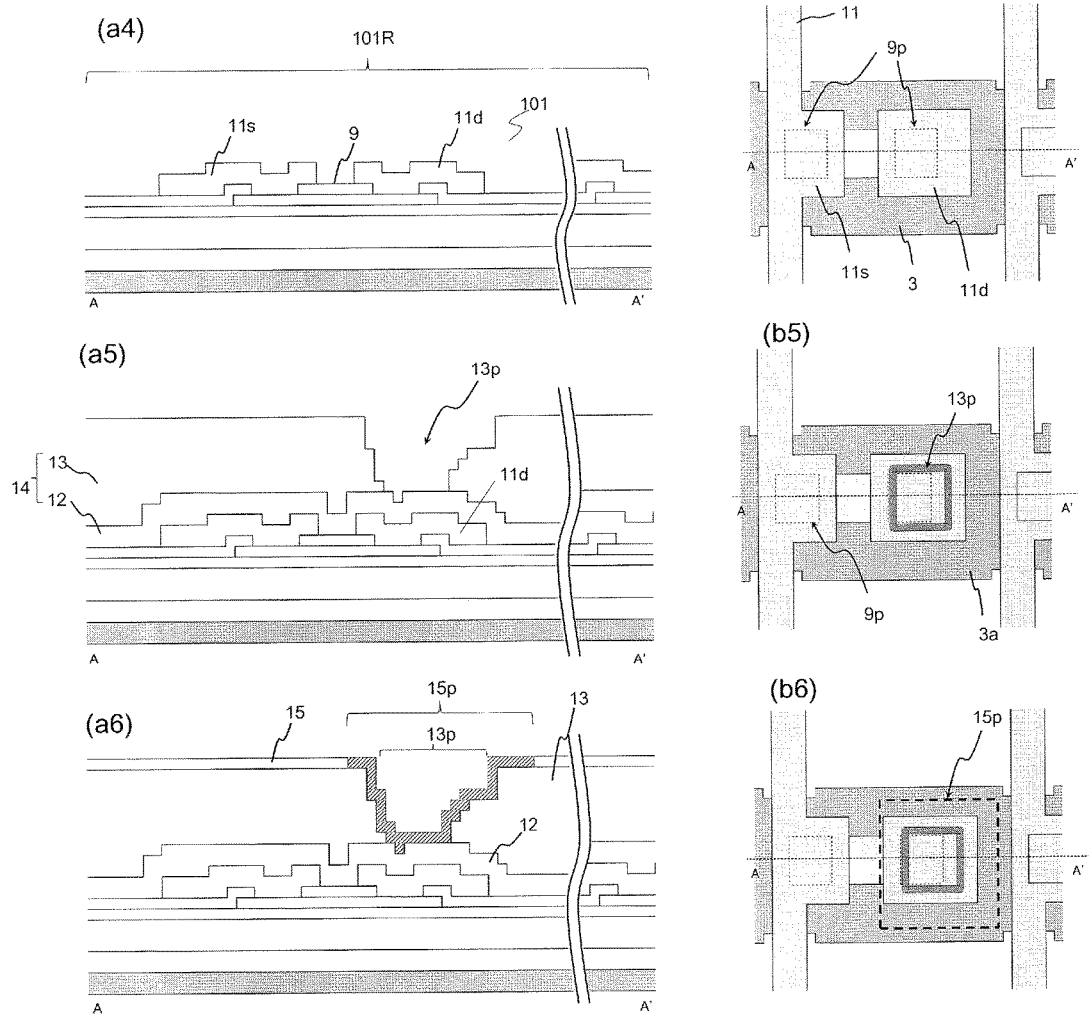
FIG. 8 Illustrates the process step of forming the TFT 101 and the contact portion 105 in the transistor forming region 101R, wherein portions (a4) through (a6) are cross-sectional views and portions (b4) through (b6) are plan views.

FIGS. 7 through 9 illustrate the process steps of forming a TFT 101 and a contact portion 105 in a transistor forming region 101R. Portions (a1) through (a8) of FIGS. 7 to 9 are cross-sectional views and portions (b1) through (b8) of FIGS. 7 to 9 are plan views. Those cross-sectional views (a1) through (a8) are viewed on the plane A-A' shown in their corresponding plan views (b1) through (b8).

Figure 10:
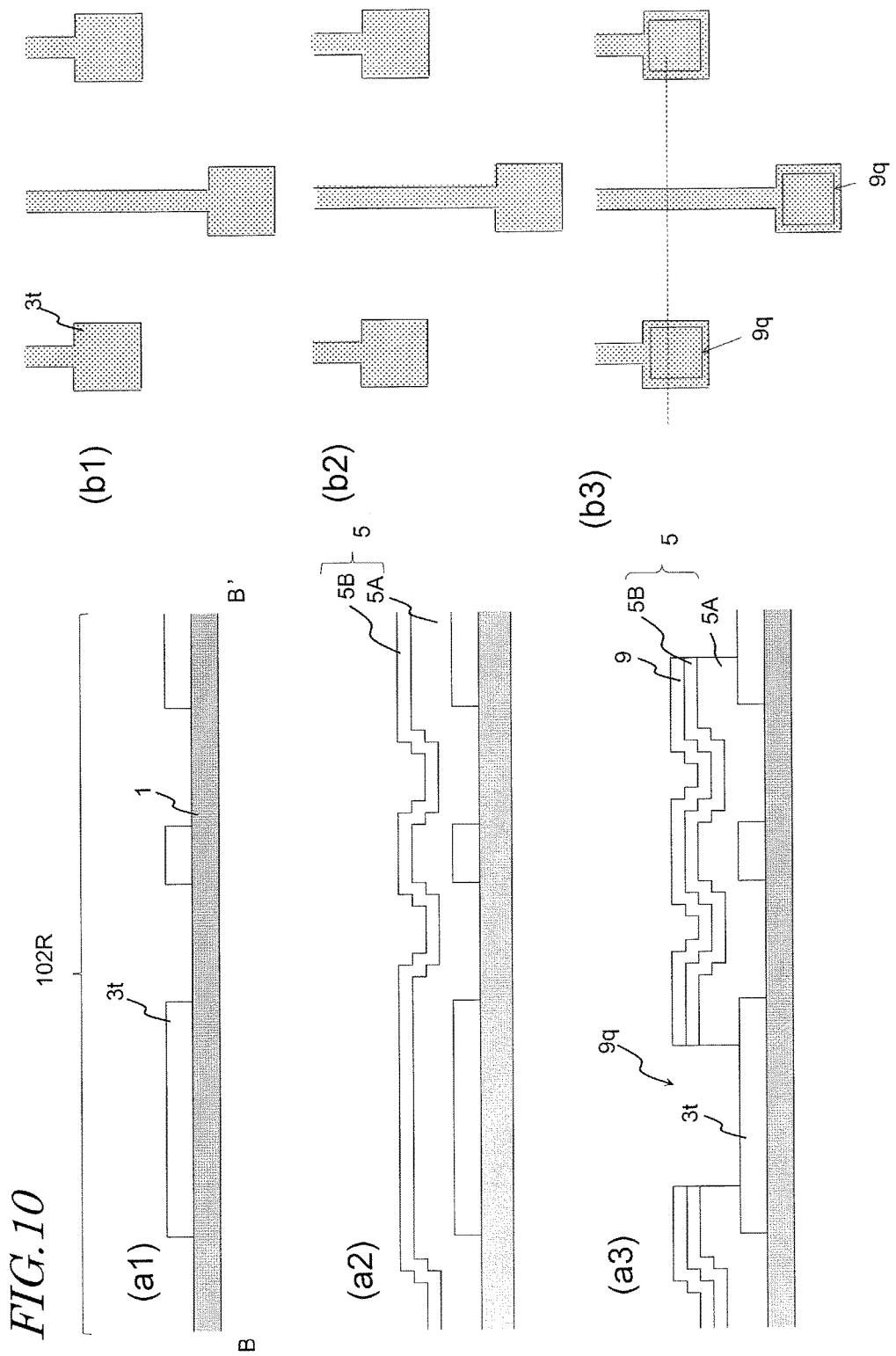
FIG. 10 Illustrates the process step of forming a terminal portion 102 in a terminal portion forming region 102R, wherein portions (a1) through (a3) are cross-sectional views and portions (b1) through (b3) are plan views.

FIGS. 10 through 12 illustrate the process steps of forming a terminal portion 102 in a terminal portion forming region 102R. Portions (a1) through (a8) of FIGS. 10 to 12 are cross-sectional views and portions (b1) through (b8) of FIGS. 10 to 12 are plan views. Those cross-sectional views (a1) through (a8) are viewed on the plane B-B' shown in their corresponding plan views (b1) through (b8).

Figure 13:
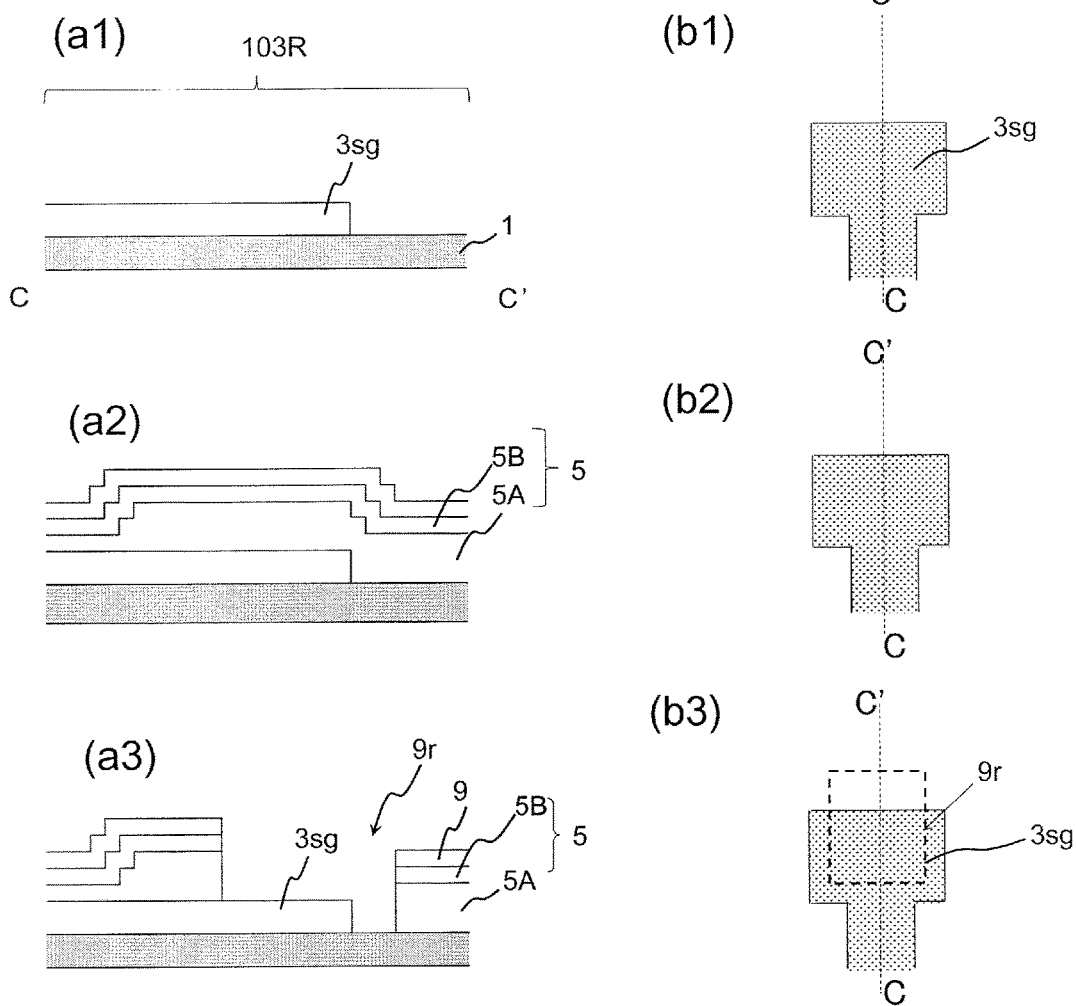
FIG. 13 Illustrates the process step of forming an S-G connecting portion 103 in an S-G connecting portion forming region 103R, wherein portions (a1) through (a3) are cross-sectional views and portions (b1) through (b3) are plan views.

FIGS. 13 through 15 illustrate the process steps of forming an S-G connecting portion 103 in an S-G connecting portion forming region 103R. Portions (a1) through (a8) of FIGS. 13 to 15 are cross-sectional views and portions (b1) through (b8) of FIGS. 13 to 15 are plan views. Those cross-sectional views (a1) through (a8) are viewed on the plane C-C' shown in their corresponding plan views (b1) through (b8).

Figure 16:
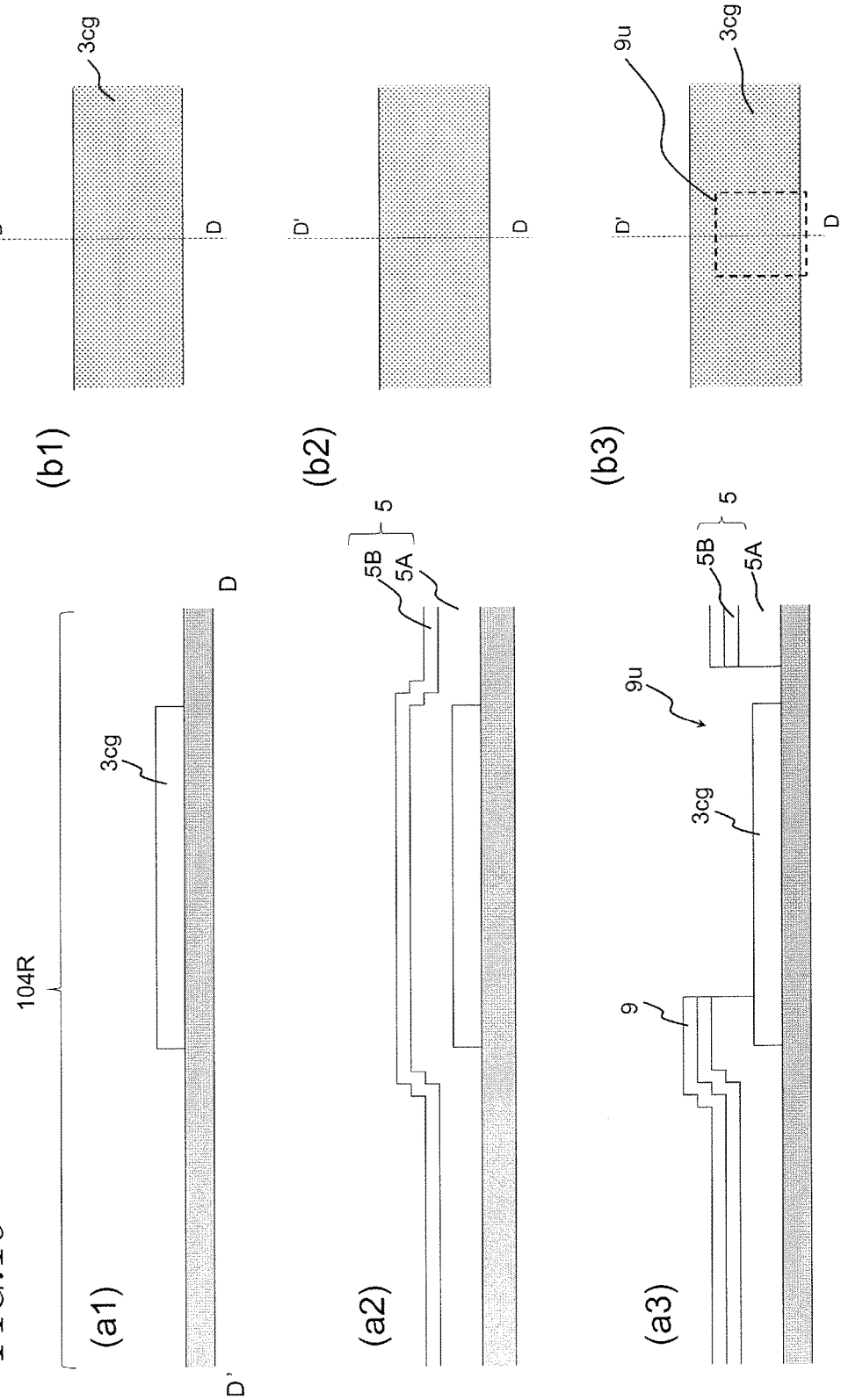
FIG. 16 Illustrates the process step of forming a COM-G connecting portion 104 in a COM-G connecting portion forming region 104R, wherein portions (a1) through (a3) are cross-sectional views and portions (b1) through (b3) are plan views.
Figure 17:
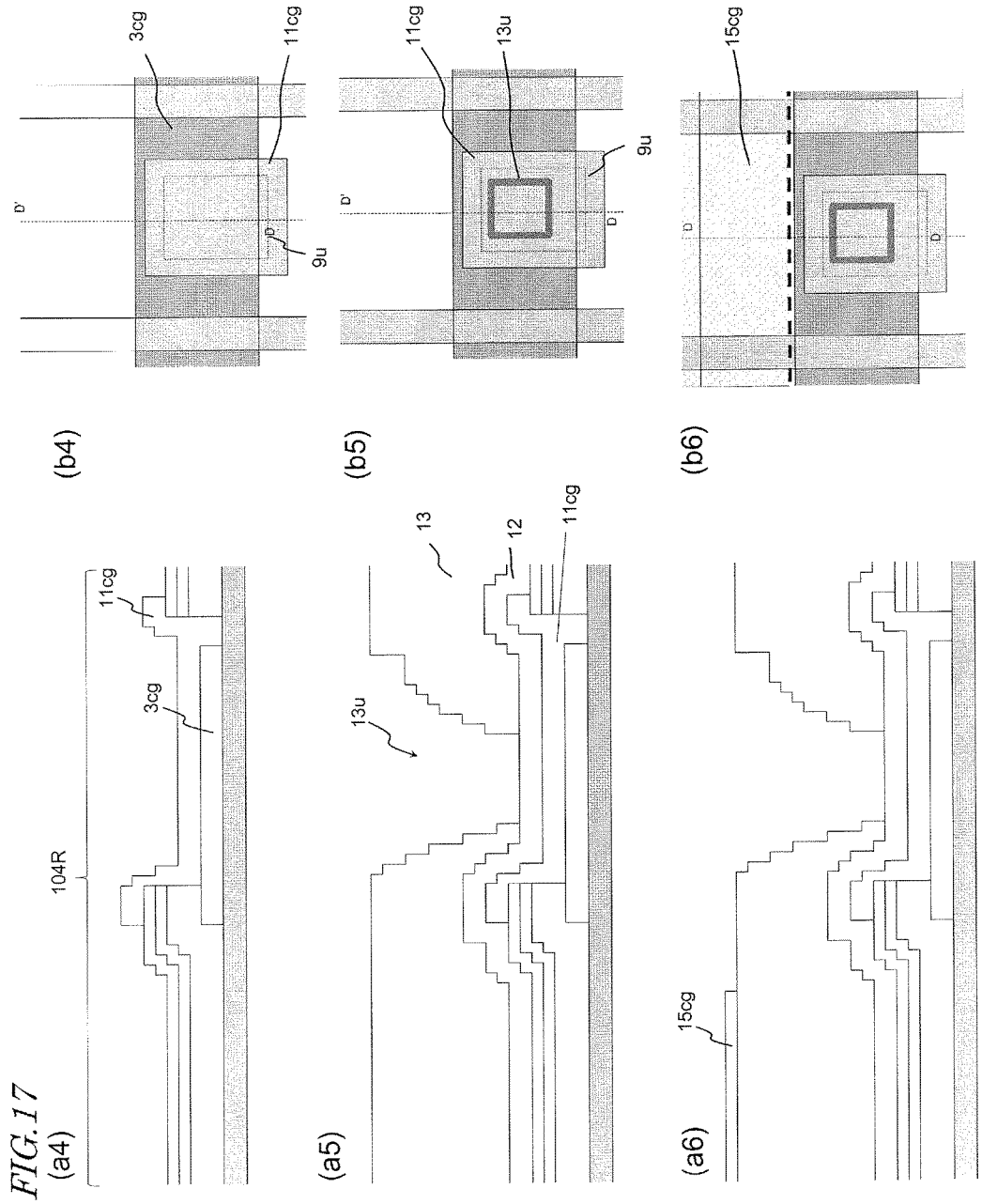
FIG. 17 Illustrates the process step of forming the COM-G connecting portion 104 in the COM-G connecting portion forming region 104R, wherein portions (a4) through (a6) are cross-sectional views and portions (b4) through (b6) are plan views.
Figure 18:
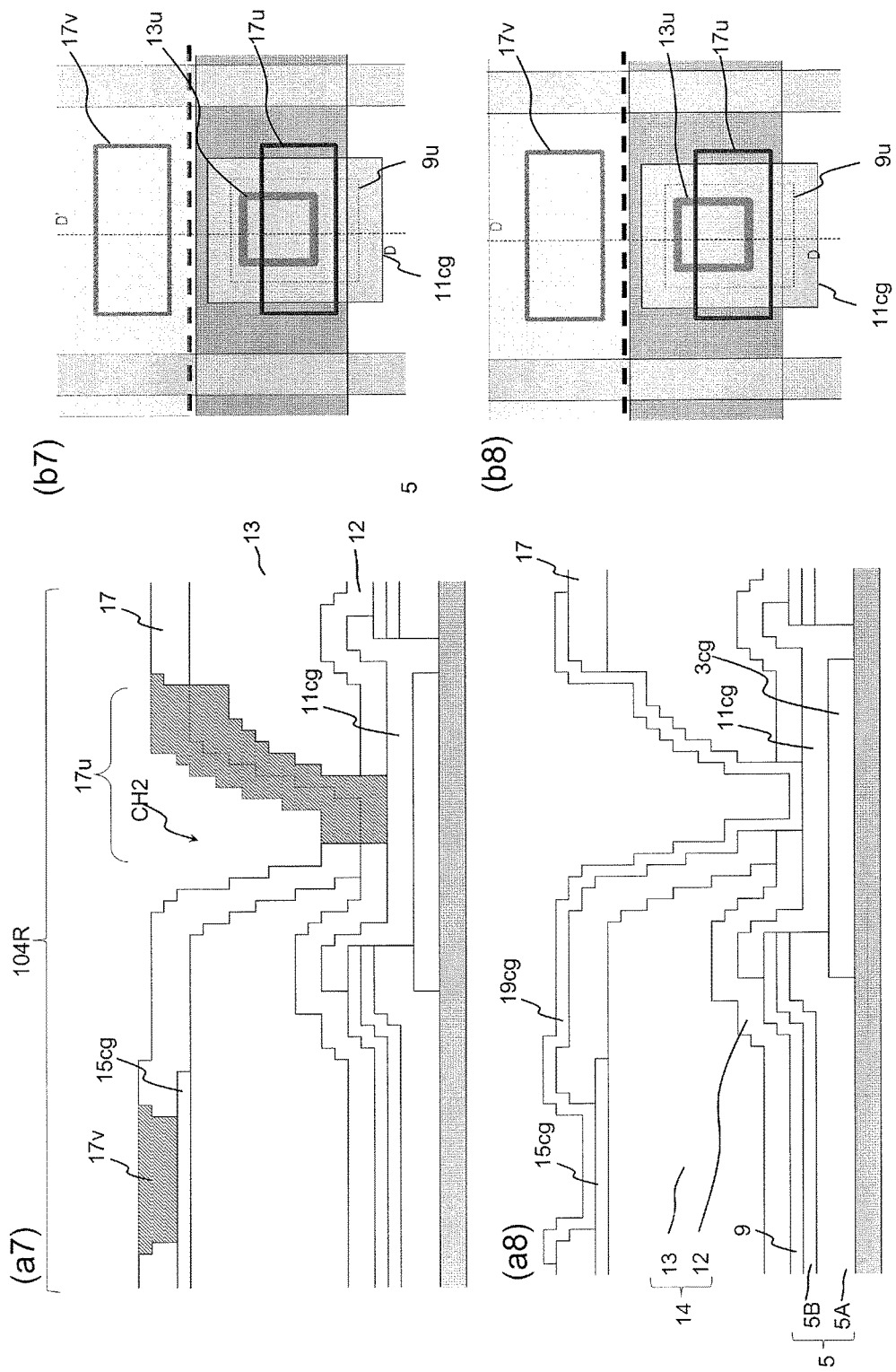
FIG. 18 Illustrates the process step of forming the COM-G connecting portion 104 in the COM-G connecting portion forming region 104R, wherein portions (a7) and (a8) are cross-sectional views and portions (b7) and (b8) are plan views.

FIGS. 16 through 18 illustrate the process steps of forming a COM-G connecting portion 104 in a COM-G connecting portion forming region 104R. Portions (a1) through (a8) of FIGS. 16 to 18 are cross-sectional views and portions (b1) through (b8) of FIGS. 16 to 18 are plan views. Those cross-sectional views (a1) through (a8) are viewed on the plane D-D' shown in their corresponding plan views (b1) through (b8).

In FIGS. 7 through 18, portions (a1) and (b1) correspond to STEP 1 shown in FIG. 6. In the same way, portions (a2) through (a8) and (b2) through (b8) in FIGS. 7 through 18 correspond to STEPS 2 through 8, respectively.

Step 1: Gate Line Forming Process Step (Shown in Portions (a1) and (b1) of FIGS. 7, 10, 13 and 16)

First of all, although not shown, a gate-line-to-be metal film is deposited to a thickness of 50 nm to 500 nm, for example, on the substrate 1. The gate-line-to-be metal film may be deposited on the substrate 1 by sputtering process, for example.

Next, a gate line layer including gate lines 3 is formed by patterning the gate-line-to-be metal film. In this process step, in the transistor forming region 101R, the gate electrode 3a of the TFT 101 is formed by patterning the gate-line-to-be metal film so that the gate electrode 3a and the gate line 3 form respective parts of the same layer as shown in portions (a1) and (b1) of FIG. 7. In this example, a portion of the gate line 3 will be the gate electrode 3a. In the same way, the lower conductive layer 3t of the terminal portion 102 is formed in the terminal portion forming region 102R (as shown in portions (a1) and (b1) of FIG. 10), the lower conductive layer 3sg of the S-G connecting portion 103 is formed in the S-G connecting portion forming region 103R (as shown in portions (a1) and (b1) of FIG. 13), and the lower conductive layer 3cg of the COM-G connecting portion 104 is formed in the COM-G connecting portion forming region 104R (as shown in portions (a1) and (b1) of FIG. 16).

As the substrate 1, a glass substrate, a silicon substrate, or a plastic substrate (resin substrate) with thermal resistance may be used, for example.

The material of the gate-line-to-be metal film is not particularly limited. But a film of a material appropriately selected from the group consisting of metals aluminum (Al), tungsten (W), molybdenum (Mo), tantalum (Ta), chromium (Cr), titanium (Ti) and copper (Cu), their alloys, and their metal nitrides, or a stack of films of any of these materials, may be used. In this example, a stack of Cu (copper) and Ti (titanium) layers is used. The upper Cu layer may have a thickness of 300 nm, for example, and the lower Ti layer may have a thickness of nm, for example. A patterning process is carried out by defining a resist mask (not shown) by known photolithographic process and then removing portions of the gate-line-to-be metal film which are not covered with the resist mask. After the patterning process is done, the resist mask will be removed.

Step 2: Gate Insulating Layer and Semiconductor Layer Forming Process Step (Shown in Portions (a2) and (b2) of FIGS. 7, 10, 13 and 16)

Next, as shown in portions (a2) and (b2) of FIGS. 7, 10, 13 and 16, a gate insulating layer 5 is formed over the substrate 1 so as to cover the gate electrode 3a and the lower conductive layers 3t, 3sg and 3cg. Thereafter, by stacking a semiconductor film on the gate insulating layer 5 and patterning the semiconductor film, a semiconductor layer 7a is formed. The semiconductor layer 7a is arranged so as to overlap at least partially with the gate electrode 3a (which forms part of the gate line 3 in this example) in the transistor forming region 101R. Optionally, the semiconductor layer 7a may be arranged so as to overlap entirely with the gate line layer (and suitably the gate line 3) with the gate insulating layer 5 interposed between them when viewed along a normal to the substrate 1. As illustrated in those drawings, the semiconductor film may be removed from the terminal portion, S-G connecting portion and COM-G connecting portion forming regions 102R, 103R and 104R.

As the gate insulating layer 5, a silicon oxide (SiOx) layer, a silicon nitride (SiNx) layer, a silicon oxynitride (SiOxNy where x>y) layer, or a silicon nitride oxide (SiNxOy where x>y) layer may be used appropriately. The gate insulating layer 5 may either be a single layer or have a multilayer structure. For example, a silicon nitride layer, a silicon nitride oxide layer or any other suitable layer may be formed as the lower layer on the substrate to prevent dopants from diffusing from the substrate 1, and a silicon oxide layer, a silicon oxynitride layer or any other suitable layer may be formed thereon as the upper layer to ensure electrical insulation. In this example, a gate insulating layer 5 with a double layer structure, consisting of first and second gate insulating layers 5A and 5B as the lower and upper layers, is formed. The first gate insulating layer 5A may be an SiNx film with a thickness of 300 nm, for example, and the second gate insulating layer 5B may be an $SiO_2$ film with a thickness of 50 nm, for example. These insulating layers 5A and 5B may be formed by CVD process, for example.

It should be noted that if an oxide semiconductor layer is used as the semiconductor layer 7a and if the gate insulating layer 5 is formed to have a multilayer structure, the top layer of the gate insulating layer 5 (i.e., the layer that contacts with the semiconductor layer) is suitably a layer including oxygen (such as an oxide layer like an $SiO_2$ layer). In that case, even if there are oxygen deficiencies in the oxide semiconductor layer, the oxygen deficiencies can be covered by oxygen included in the oxide layer. As a result, such oxygen deficiencies of an oxide semiconductor layer can be reduced effectively.

The semiconductor layer 7a is not particularly limited and may be an amorphous silicon semiconductor layer or a polysilicon semiconductor layer, for example. In this embodiment, an oxide semiconductor layer is formed as the semiconductor layer 7a. For example, an oxide semiconductor film (not shown) is deposited to a thickness of 30 nm to 200 nm on the gate insulating layer 5 by sputtering process. The oxide semiconductor film may be an In—Ga—Zn—O based amorphous oxide semiconductor film including In, Ga and Zn at a ratio of one to one to one (i.e., an IGZO film), for example. In this example, an IGZO film with a thickness of 50 nm, for example, is formed as the oxide semiconductor film. Thereafter, the oxide semiconductor film is patterned by photolithographic process to obtain a semiconductor layer 7a, which is arranged so as to overlap with the gate electrode 3a with the gate insulating layer 5 interposed between them.

In the IGZO film, In, Ga and Zn do not have to have the ratio described above but may also have any other appropriately selected ratio. IGZO may be either amorphous or crystalline. If a crystalline IGZO film is used, the c-axis of its crystals is suitably oriented substantially perpendicularly to the film plane. The crystal structure of such an IGZO film is disclosed in Japanese Laid-Open Patent Publication No. 2012-134475, for example, the entire disclosure of which is hereby incorporated by reference. Alternatively, the semiconductor layer 7a may also be made of another oxide semiconductor film, instead of the IGZO film. Examples of other oxide semiconductor films include $InGaO_3(ZnO)_5$, magnesium zinc oxide ($Mg_xZn_{n1}$-xO), cadmium zinc oxide ($Cd_xZn_{1-x}O$) and cadmium oxide (CdO) films.

Step 3: Protective Layer and Gate Insulating Layer Etching Process Step (Shown in Portions (a3) and (b3) of FIGS. 7, 10, 13 and 16)

Next, as shown in portions (a3) and (b3) of FIGS. 7, 10, 13 and 16, a protective layer 9 is formed to a thickness of 30 nm to 200 nm, for example, on the semiconductor layer 7a and the gate insulating layer 5. Subsequently, the protective layer 9 and the gate insulating layer 5 are etched through a resist mask (not shown). In this process step, the etching condition is determined according to the materials of the respective layers so that only the protective layer 9 and the gate insulating layer 5 are etched selectively but the semiconductor layer 7a is not etched. In this case, if a dry etching process is adopted, the etching condition includes the type of the etch gas, the temperature of the substrate 1, and the degree of vacuum in the chamber. On the other hand, if a wet etching process is adopted, then the etching condition includes the type of the etchant and the etching process time.

As a result, in the transistor forming region 101R, a hole 9p is cut through the protective layer 9 to expose portions on right- and left-hand sides of a part of the semiconductor layer 7a to be a channel region as shown in portions (a3) and (b3) of FIG. 7. In this etching process step, the semiconductor layer 7a functions as an etch stopper. It should be noted that the protective layer 9 may be patterned so as to cover at least that part to be a channel region. That part of the protective layer 9 to be located over the channel region functions as a chapter protective film. With that film, the damage to be done later on the semiconductor layer 7a as a result of the etching process in the source and drain separating process step, for example, can be minimized, and therefore, the deterioration of the TFT characteristic can be reduced.

Meanwhile, in the terminal portion forming region 102R, the protective layer 9 and the gate insulating layer 5 are etched at a time (GI/ES simultaneous etching), and a hole 9q that exposes the lower conductive layer 3t is cut through the protective layer 9 and the gate insulating layer 5 as shown in portions (a3) and (b3) of FIG. 10. In the same way, in the S-G connecting portion and COM-G connecting portion forming regions 103R and 104R, holes 9r and 9u that expose the surface of the lower conductive layers 3sg and 3cg are cut through the protective layer 9 and the gate insulating layer 5 as shown in portions (a3) and (b3) of FIGS. 13 and 16. In the example illustrated in those drawings, the holes 9r and 9u are cut so as to partially expose the upper surface of the lower conductive layers 3sg and 3cg and the side surface of their end portions.

The protective layer 9 may be a silicon oxide film, a silicon nitride film, a silicon oxynitride film or a stack of any of these films. In this example, a silicon dioxide ($SiO_2$) film is deposited as the protective layer 9 to a thickness of 100 nm, for example, by CVD process.

It should be noted that depending on the type of the semiconductor layer 7a, the protective layer 9 may be omitted. If the semiconductor layer 7a is an oxide semiconductor layer, however, the protective layer 9 is suitably provided, because the process damage to be done on the oxide semiconductor layer can be reduced with that protective layer. As the protective layer 9, an oxide film such as an SiOx film (including an $SiO_2$ film) is suitably used. In that case, even if there are oxygen deficiencies in the oxide semiconductor layer, the oxygen deficiencies can be covered by oxygen included in the oxide film. As a result, such oxygen deficiencies of an oxide semiconductor layer can be reduced more effectively. In this example, an $SiO_2$ film with a thickness of 100 nm, for example, is used as the protective layer 9.

Step 4: Source and Drain Forming Process Step (Shown in Portions (a4) and (b4) of FIGS. 8, 11, 14 and 17)

Next, as shown in portions (a4) and (b4) of FIGS. 8, 11, 14 and 17, a source-line-to-be metal film 11 is formed to a thickness of 50 nm to 500 nm, for example, over the protective layer 9 and inside the holes 9p, 9q, 9r and 9u. The source-line-to-be metal film may be formed by sputtering process, for example.

Subsequently, a source line (not shown) is formed by patterning the source-line-to-be metal film. In this process step, source and drain electrodes 11s and 11d are formed out of the source-line-to-be metal film in the transistor forming region 101R as shown in portions (a4) and (b4) of FIG. 8. The source and drain electrodes 11s and 11d are connected to the semiconductor layer 7a inside the hole 9p. In this manner, a TFT 101 is completed.

Meanwhile, in the terminal portion forming region 102R, an upper conductive layer 11t to contact with the lower conductive layer 3t inside the hole 9q is formed out of the source-line-to-be metal film (as shown in portions (a4) and (b4) of FIG. 11). In the same way, in the S-G connecting portion forming region 103R, formed is an upper conductive layer 11sg to contact with the lower conductive layer 3sg inside the hole 9r (as shown in portions (a4) and (b4) of FIG. 14). And in the COM-G connecting portion forming region 104R, formed is an upper conductive layer 11cg to contact with the lower conductive layer 3cg inside the hole 9u (as shown in portions (a4) and (b4) of FIG. 17).

The material of the source-line-to-be metal film is not particularly limited. But a film made of a material selected from the group consisting of metals aluminum (Al), tungsten (W), molybdenum (Mo), tantalum (Ta), copper (Cu), chromium (Cr), and titanium (Ti), their alloys, and their metal nitrides may be used appropriately. In this example, a stack of a lower Ti layer (with a thickness of 30 nm) and an upper Cu layer (with a thickness of 300 nm) is used, for example.

Step 5: Interlevel Insulating Layer Forming Process Step (Shown in Portions (a5) and (b5) of FIGS. 8, 11, 14 and 17)

Next, as shown in portions (a5) and (b5) of FIGS. 8, 11, 14 and 17, a first insulating layer 12 and a second insulating layer 13 are deposited in this order so as to cover the TFT 101 and the upper conductive layers 11t, 11sg and 11cg. In this embodiment, an inorganic insulating layer (passivation film) is formed by CVD process, for example, as the first insulating layer 12. Next, an organic insulating layer, for example, is formed as the second insulating layer 13 on the first insulating layer 12. And then the second insulating layer 13 is patterned.

As a result, in the transistor forming region 101R, a hole 13p that exposes the first insulating layer 12 is cut through a portion of the second insulating layer 13 which is located over the drain electrode 11d as shown in portions (a5) and (b5) of FIG. 8. Meanwhile, in the terminal portion forming region 102R, the second insulating layer 13 is removed. As a result, the upper conductive layer 11t is covered with only the first insulating layer 12 (as shown in portions (a5) and (b5) of FIG. 11). In the S-G connecting portion forming region 103R, the upper conductive layer 11sg is covered with both of the first and second insulating layers 12 and 13 (as shown in portions (a5) and (b5) of FIG. 14). And in the COM-G connecting portion forming region 104R, a hole 13u that exposes the first insulating layer is cut through a portion of the second insulating layer 13 which is located over the upper conductive layer 11cg as shown in portions (a5) and (b5) of FIG. 17.

As the first insulating layer 12, a silicon oxide (SiOx) film, a silicon nitride (SiNx) film, a silicon oxynitride (SiOxNy where x>y) film, or a silicon nitride oxide (SiNxOy where x>y) film may be used appropriately. Optionally, an insulating material of any other film quality may also be used. The second insulating layer 13 is suitably a layer made of an organic material and may be a positive photosensitive resin film, for example. In this embodiment, an $SiO_2$ film with a thickness of 200 nm, for example, and a positive photosensitive resin film with a thickness of 2000 nm, for example, are used as the first and second insulating layers 12 and 13, respectively.

It should be noted that the insulating layers 12 and 13 do not always have to be made of these materials. Rather, the materials and etching conditions of these insulating layers 12 and 13 may be selected so that the second insulating layer 13 can be etched without etching the first insulating layer 12.

Therefore, the second insulating layer 13 may be an inorganic insulating layer, for example.

Step 6: First Transparent Conductive Layer Forming Process Step (Shown in Portions (a6) and (b6) of FIGS. 8, 11, 14 and 17)

Next, a transparent conductive film (not shown) is deposited on the insulating layer 13 and inside the holes 13p and 13u by sputtering process, for example, and then patterned by known photolithographic process, for instance.

In the transistor forming region 101R, by patterning the transparent conductive film, portions of the transparent conductive film which are located inside and on the periphery of the hole 13p are removed as shown in portions (a6) and (b6) of FIG. 8. It should be noted that in portion (a6) of FIG. 8, the portion to be removed is indicated by the shadow. In the other drawings, such a portion to be removed is sometimes indicated by the shadow in the same way. In this manner, a first transparent conductive layer 15 with a hole 15p is formed. An end portion of the first transparent conductive layer 15 closer to the hole 15p is located on the upper surface of the insulating layer 13. In other words, when viewed along a normal to the substrate 1, the hole 13p of the insulating layer 13 is located inside the hole 15p of the first transparent conductive layer 15.

Although it cannot be seen easily from portion (b6) of FIG. 8, according to this embodiment, the first transparent conductive layer 15 has been formed to cover the pixel almost entirely but the hole 15p.

Meanwhile, in the terminal portion forming region 102R and the S-G connecting portion forming region 103R, the transparent conductive film is removed (as shown in portions (a6) and (b6) of FIGS. 11 and 14).

As shown in portions (a6) and (b6) of FIG. 17, a lower transparent connecting layer 15cg is formed out of the transparent conductive film in the COM-G connecting portion forming region 104R. At least portions of the transparent conductive film which are located inside and on the periphery of the hole 13u are removed and an end portion of the lower transparent connecting layer 15cg is located over the upper surface of the second insulating layer 13. In other words, when viewed along a normal to the substrate 1, the hole 13u of the second insulating layer 13 is located in a region where there is no lower transparent connecting layer 15cg. The lower transparent connecting layer 15cg and the first transparent conductive layer 15 as the common electrode may be formed out of the same film.

As the transparent conductive film to make the first transparent conductive layer 15 and the lower transparent connecting layer 15cg, an ITO (indium tin oxide) film (with a thickness of 50 nm to 200 nm), an IZO film or a ZnO (zinc oxide) film may be used, for example. In this example, an ITO film with a thickness of 100 nm, for example, is used as the transparent conductive film.

Step 7: Dielectric Layer Forming Process Step (Shown in Portions (a7) and (b7) of FIGS. 9, 12, 15 and 18)

Next, a dielectric layer 17 is deposited over the entire surface of the substrate 1 by CVD process, for example. Subsequently, a resist mask (not shown) is formed on the dielectric layer 17 to etch the dielectric layer 17 and the first insulating layer 12. In this process step, the etching condition is set according to the materials of the respective insulating layers so that the dielectric layer 17 and the first insulating layer 12 will be etched but that the second insulating layer 13 will not be etched.

As a result, as shown in portions (a7) and (b7) of FIG. 9, a dielectric layer 17 is formed over the first transparent conductive layer 15 and inside the hole 13p in the transistor forming region 101R. The dielectric layer 17 is formed to cover the end portion (side surface) of the first transparent conductive layer 15 closer to the hole 15p. Next, a portion of the dielectric layer 17 which is located over the drain electrode 11d and a portion of the first insulating layer 12 which is also located over the drain electrode 11d and which is not covered with the second insulating layer 13 are etched simultaneously. Since the two passivation films (that are the insulating layers 12 and 17) are etched at a time as a result of this process step, this etching process step will be sometimes referred to herein as a "PAS1/PAS2 simultaneous etching" process step. As a result of this PAS1/PAS2 simultaneous etching process step, a contact hole CH1 which exposes the surface of the drain electrode 11d is cut through the dielectric layer 17 and the first and second insulating layers 12 and 13. On the sidewall of the contact hole CH1, the side surface of the first insulating layer 12 is aligned with that of the inner one of the dielectric layer 17 and the second insulating layer 13.

In this example, the hole 17p of the dielectric layer 17 is arranged so as to be located inside the hole 15p of the first transparent conductive layer 15 and to partially overlap with the hole 13p when viewed along a normal to the substrate 1. In that region where these holes 13p and 15p overlap with each other, the drain electrode 11d is exposed. A portion of the side surface of the first insulating layer 12 is aligned with the dielectric layer 17, while another portion thereof is aligned with the second insulating layer 13.

Also, as shown in portions (a7) and (b7) of FIG. 12, in the terminal portion forming region 102R, the dielectric layer 17 and the first insulating layer 12 are etched simultaneously (through the PAS1/PAS2 simultaneous etching) to cut a hole 17q (contact hole) that exposes the surface of the upper conductive layer 11t. On the sidewall of the hole 17q, the respective side surfaces of the first insulating layer 12 and dielectric layer 17 are aligned with each other.

As shown in portions (a7) and (b7) of FIG. 15, a dielectric layer 17 is formed on the insulating layer 13 in the S-G connecting portion forming region 103R.

As shown in portions (a7) and (b7) of FIG. 18, in the COM-G connecting portion forming region 104R, a dielectric layer 17 is formed over the second insulating layer 13 and the lower transparent connecting layer 15cg and inside the hole 13u. Thereafter, portions of the dielectric layer 17 located over the lower transparent connecting layer 15cg and the upper conductive layer 11cg, respectively, are etched away. In this process step, a portion of the first insulating layer 12 which is located over the upper conductive layer 11cg and which is not covered with the insulating layer 13 is also etched at the same time (through the PAS1/PAS2 simultaneous etching). In this manner, a hole 17v (contact hole) can be cut through the dielectric layer 17 to expose the surface of the lower transparent connecting layer 15cg and a contact hole CH2 can be cut through the dielectric layer 17 and the insulating layers 12 and 13 to expose the surface of the upper conductive layer 11cg. Just like the contact hole CH1 to form the contact portion 105, on the sidewall of this contact hole CH2, the side surface of the first insulating layer 12 is also aligned with that of the inner one of the dielectric layer 17 and the second insulating layer 13.

In this example, the hole 17u of the dielectric layer 17 is arranged so as to partially overlap with the hole 13u of the second insulating layer 13 when viewed along a normal to the substrate 1. In the region where these holes 13u and 17u overlap with each other, the upper conductive layer 11cg is exposed. On the sidewall of the contact hole CH2, a portion of the side surface of the first insulating layer 12 is aligned with the dielectric layer 17 and another portion thereof is aligned with the insulating layer 13.

As the dielectric layer 17, a silicon oxide (SiOx) film, a silicon nitride (SiNx) film, a silicon oxynitride (SiOxNy where x>y) film, or a silicon nitride oxide (SiNxOy where x>y) film may be used appropriately, for example. Since the dielectric layer 17 is used as a capacitive insulating film to form a storage capacitor in this embodiment, the material and thickness of the dielectric layer 17 are suitably selected appropriately so as to obtain a predetermined capacitance $C_{CS}$. As the material of the dielectric layer 17, SiNx is suitably used in view of its dielectric constant and electrical insulating property. The dielectric layer 17 may have a thickness of 150 nm to 400 nm, for example. If the dielectric layer 17 has a thickness of at least 150 nm, electrical insulation can be achieved with more certainty. On the other hand, if the dielectric layer 17 has a thickness of 400 nm or less, then the predetermined capacitance can be obtained with more certainty. In this embodiment, an SiNx film with a thickness of 300 nm, for example, is used as the dielectric layer 17.

Step 8: Second Transparent Conductive Layer Forming Process Step (Shown in Portions (a8) and (b8) of FIGS. 9, 12, 15 and 18)

Subsequently, a transparent conductive film (not shown) is deposited by sputtering process, for example, over the dielectric layer 17 and inside the contact holes CH1, CH2 and the holes 17q, 17v and then patterned by known photolithographic process, for example.

As a result, as shown in portions (a8) and (b8) of FIG. 9, a second transparent conductive layer 19a is formed in the transistor forming region 101R. The second transparent conductive layer 19a contacts with the drain electrode 11d inside the contact hole CH1. Also, at least a part of the second transparent conductive layer 19a is arranged so as to overlap with the first transparent conductive layer 15 with the dielectric layer 17 interposed between them. In this embodiment, the second transparent conductive layer 19a functions as a pixel electrode in an FFS mode display device. In that case, as shown in portion (b8) of FIG. 9, a plurality of slits may be cut in each pixel through a portion of the second transparent conductive layer 19a which does not overlap with the gate line 3 as shown in portion (b8) of FIG. 9.

As shown in portions (a8) and (b8) of FIG. 12, in the terminal portion forming region 102R, an external connecting layer 19t for the terminal portion 102 is formed out of a transparent conductive film. The external connecting layer 19t is connected to the upper conductive layer 11t inside the hole 17q.

As shown in portions (a8) and (b8) of FIG. 18, in the COM-G connecting portion forming region 104R, an upper transparent connecting layer 19cg is formed out of a transparent conductive film. The upper transparent connecting layer 19cg has a pattern which covers both the contact hole CH2 and the hole 17v. That is why the upper transparent connecting layer 19cg contacts with the upper conductive layer 11cg inside the contact hole CH2 and also contacts with the lower transparent connecting layer 15cg inside the hole 17v. As a result, the lower transparent connecting layer 15cg can be connected to the lower conductive layer 3cg through the upper transparent connecting layer 19cg and the upper conductive layer 11cg.

As the transparent conductive film to make the second transparent conductive layer 19a and the upper transparent connecting layer 19cg, an ITO (indium tin oxide) film (with a thickness of 50 nm to 150 nm), an IZO film or a ZnO (zinc oxide) film, for example may be used. In this example, an ITO film with a thickness of 100 nm, for example, is used as the transparent conductive film.

Modified Example of Semiconductor Device 100

Variation of Contact Portion 105

The contact portion 105, terminal portion 102, S-G connecting portion 103 and COM-G connecting portion 104 of the semiconductor device 100 do not have to have the configuration described above, but may also be modified appropriately as needed. Hereinafter, modified examples of respective portions will be described. It should be noted that each of the modified examples to be described below may be fabricated following the flow shown in FIG. 6.

Figure 20:
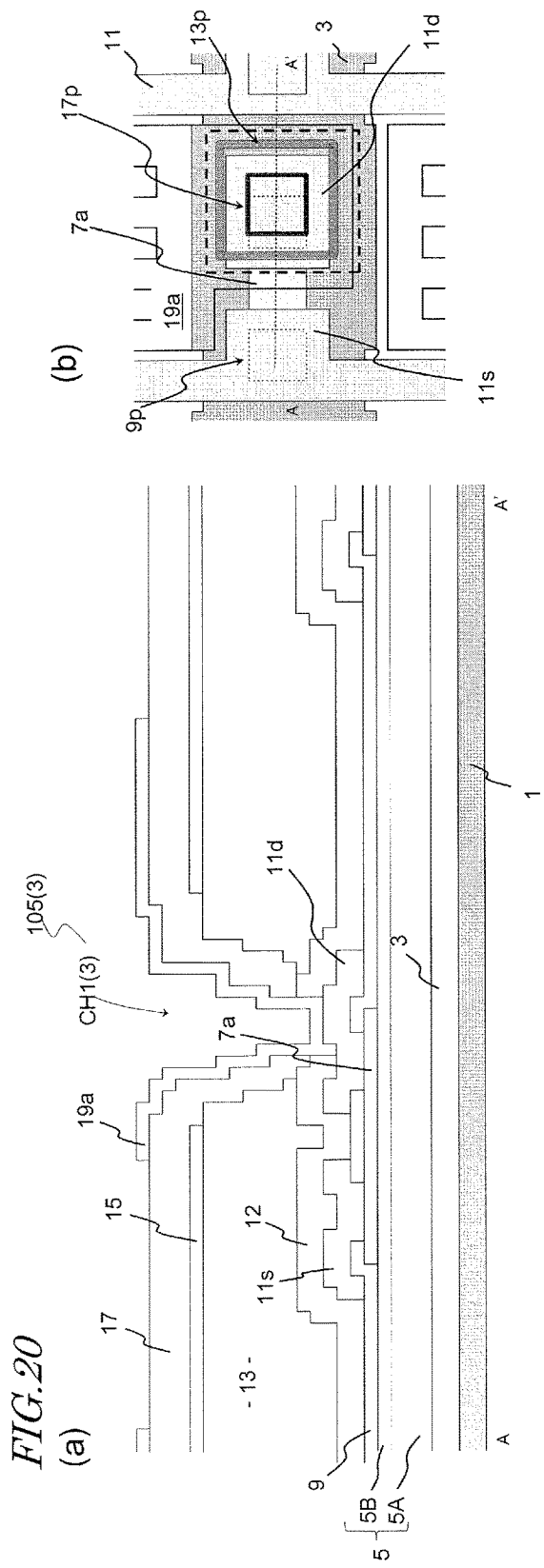
FIGS. 20 (*a*) and (*b*) are respectively a cross-sectional view and a plan view illustrating a contact portion 105(3) according to another modified example.

FIGS. 19 and 20 illustrate contact portions 105(2) and 105(3), respectively. In each of FIGS. 19 and 20, portion (a) is a cross-sectional view and portion (b) is a plan view.

Each of these contact portions 105(2) and 105(3) according to this modified example may be formed by performing the process step of etching the dielectric layer 17 and the insulating layer 12 at a time just before forming the second transparent conductive layer 19a as a pixel electrode as in the example shown in FIG. 2. Consequently, the process damage to be done on the surface of the drain electrode 11d can be reduced significantly.

As can be seen from the plan view shown in FIG. 19(b), in the contact portion 105(2) shown in FIG. 19, the respective holes 13p and 17p have been cut so that the hole 13p of the insulating layer 13 is located inside of the hole 17p of the dielectric layer 17 when viewed along a normal to the substrate 1. That is why the sidewall of the contact hole CH1(2) is formed by the insulating layers 12, 13 and the dielectric layer 17 as shown in FIG. 19(a). On the sidewall of the contact hole CH1(2), the side surface of the first insulating layer 12 is aligned with the side surface of the second insulating layer 13.

According to such a configuration, the hole 13p to be cut through the second insulating layer 13 in the vicinity of the channel can have its size reduced. Thus, it is possible to prevent water from entering the TFT 101 through the hole 13p to affect its characteristic. Nevertheless, a portion of the second insulating layer 13 which is exposed through the hole 17p of the dielectric layer 17 is easily subject to etching damage and could have a roughened surface while the contact hole CH1(2) is being cut. In addition, due to the etching damage done on the second insulating layer 13 as an underlying layer, it is difficult to control the tapered shape of the patterned edge (i.e., the end portion of the hole 17p) of the dielectric layer 17 with high precision. And this might constitute a factor in an increase in connection resistance value.

In the contact portion 105(3) shown in FIG. 20, the respective holes 13p and 17p are cut so that when viewed along a normal to the substrate 1, the hole 17p of the dielectric layer 17 is located in its entirety inside the outer edge of the hole 13p of the second insulating layer 13 as can be seen from the plan view shown in FIG. 20(b). That is why as shown in FIG. 20(a), the sidewall of the contact hole CH1(3) is formed by the first insulating layer 12 and the dielectric layer 17. The second insulating layer 13 is not exposed on the sidewall of the contact hole CH1(3). Also, on the sidewall of the contact hole CH1(3), the side surface of the first insulating layer 12 is aligned with that of the dielectric layer 17.

According to such a configuration, the contact hole CH1(3) can be cut in the intended tapered shape with good stability by performing the process step of etching the dielectric layer 17 and the first insulating layer 12 at a time (through the PAS1/PAS2 simultaneous etching). As a result, the connection resistance value can be reduced with more certainty. However, since the hole 13p to be cut through the second insulating layer 13 in the vicinity of the channel comes to have an increased size, water might enter the TFT 101 through the hole 13p to affect its characteristic.

In the configuration that has already been described with reference to FIGS. 2(a) and 2(b), the respective holes 13p and 17p are cut so that when viewed along a normal to the substrate 1, the outer edges of the holes 17p and 13p of the dielectric layer 17 and insulating layer 13 intersect with each other at two points.

According to such a configuration, the advantages of the contact portions 105(2) and 105(3) of the modified examples described above can be both achieved. Specifically, since the hole 13p to be cut through the second insulating layer 13 in the vicinity of the channel can have a relatively small size, it is possible to prevent water or anything else unwanted from entering the TFT. In addition, since the contact hole CH1 can be cut in the intended tapered shape with good stability by performing the process step of etching the dielectric layer 17 and the first insulating layer 12 at a time, the connection resistance value can be reduced to a sufficiently low level. On top of that, compared to the contact portions 105(2) and 105(3), the contact portion 105 can have a smaller size. Nevertheless, the area of the portion of the drain electrode 11d to be exposed through the contact hole CH1 and the resistance value might decrease due to a misalignment between the respective patterns for the second insulating layer 13 and dielectric layer 17.

As can be seen, the respective configurations of those contact portions 105, 105(2) and 105(3) shown in FIGS. 2, 19 and 20 have their own advantages. And one of these configurations may be appropriately chosen according to the intended application and size of the semiconductor device 100.

Variation of COM-G Connecting Portion 104 and COM-S Connecting Portion

Figure 21:
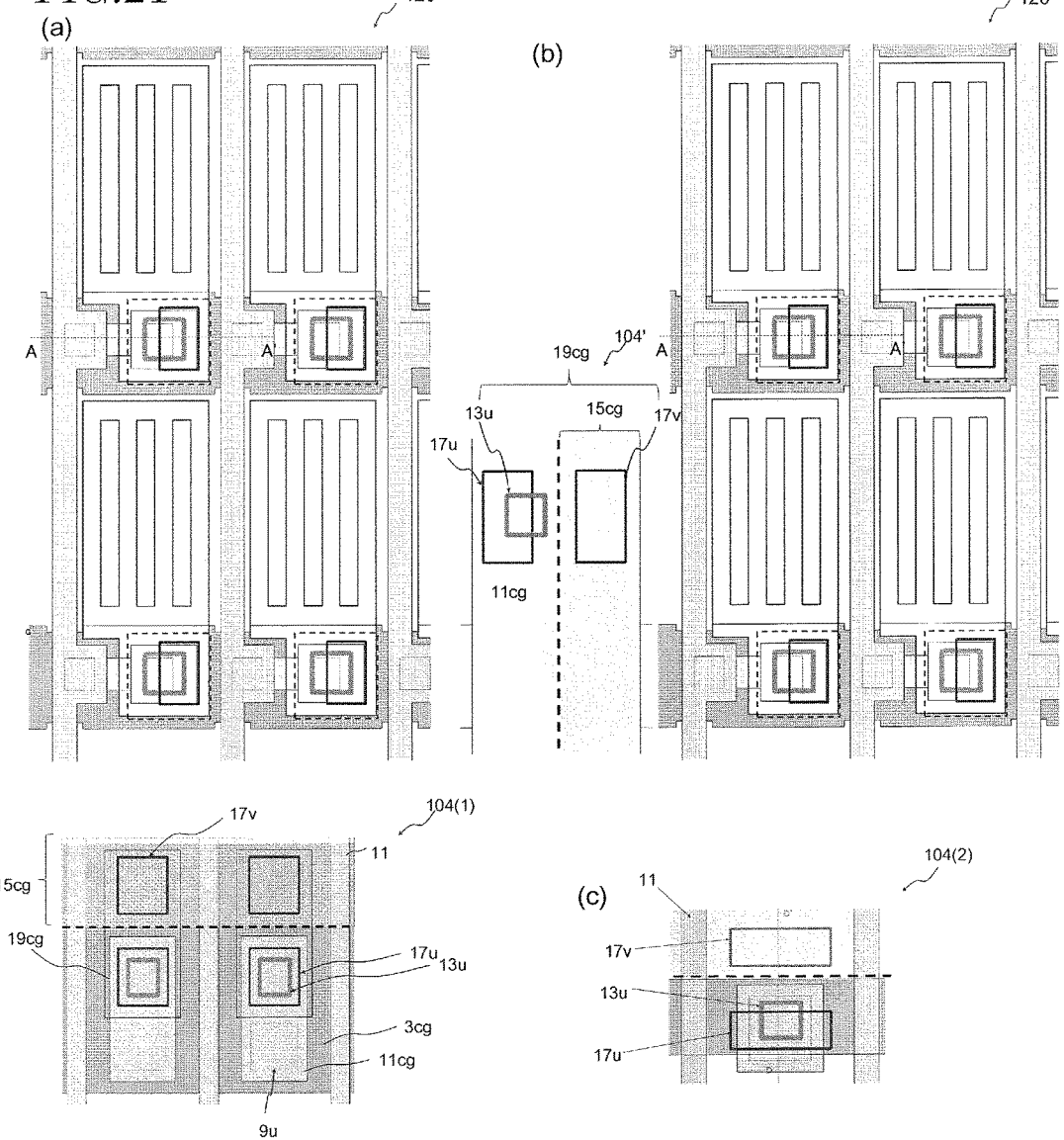
FIG. 21 Plan views illustrating variations of the COM-G connecting portion and a COM-S connecting portion, wherein (a) and (c) illustrate COM-G connecting portions 104(1) and 104(2) and (b) illustrates a COM-S connecting portion.

FIG. 21(a) is a plan view illustrating a variation of the COM-G connecting portion 104. FIG. 21(b) is a plan view illustrating the COM-S connecting portion. And the COM-G connecting portion 104(2) shown in FIG. 21(c) is the same as the COM-G connecting portion 104 shown in FIG. 3.

Each of the COM-G connecting portions 104(1) and 104(2) shown in FIGS. 21(a) and 21(c) is configured to connect the lower transparent connecting layer 15cg to a COM signal line $G_{COM}$ (see FIG. 1) which has been formed out of the same conductive film as the gate line 3. On the other hand, the COM-S connecting portions 104' shown in FIG. 21(b) is configured to connect the lower transparent connecting layer 15cg to a COM signal line $S_{COM}$ (see FIG. 1) which has been formed out of the same conductive film as the source line 11. In other words, the gate line layer includes the COM signal line $G_{COM}$ and the source line layer includes the COM signal line Saw.

Each of these COM-G connecting portions 104(1) and 104(2) and the COM-S connecting portion 104' has a structure in which either the lower conductive layer 3cg that has been formed out of the gate-line-to-be metal film or the upper conductive layer 11cg that has been formed out of the source-line-to-be metal film is electrically connected to the lower transparent connecting layer 15cg using the upper transparent connecting layer 19cg. And each of these COM-G connecting portions 104(1) and 104(2) and the COM-S connecting portion 104' may be formed by performing the step of etching the dielectric layer 17 and the insulating layer 12 at a time just before forming the upper transparent connecting layer 19cg.

The COM-G connecting portion 104(1) shown in FIG. 21(a) is arranged between adjacent source lines 11, for example, in the peripheral area when viewed along a normal to the substrate. In this example, the COM-G connecting portion 104(1) has been formed between the display area 120 and the terminal portion (source terminal portion) 102.

The COM-G connecting portion 104(1) has a layout in which a connecting portion to connect the lower and upper conductive layers 3cg and 11cg together (i.e., a G-S connecting portion), a connecting portion to connect the upper conductive layer 11cg and the upper transparent connecting layer 19cg together (i.e., an S-Pix connecting portion) and a connecting portion to connect the upper and lower transparent connecting layers 19cg and 15cg together (i.e., a Pix-COM connecting portion) are provided as three separate portions when viewed along a normal to the substrate 1. The lower conductive layer 3cg may be the COM signal line $G_{COM}$ shown in FIG. 1, for example. In the G-S connecting portion, the lower and upper conductive layers 3cg and 11cg are connected together via the hole 9u that has been cut through the gate insulating layer 5 and the protective layer 9. In the S-Pix connecting portion, the upper conductive layer 11cg and the upper transparent connecting layer 19cg are connected together via the hole 13u that has been cut through the insulating layers 12, 13 and the hole 17u that has been cut through the dielectric layer 17. In this example, the hole 13u of the second insulating layer 13 is located inside the hole 17u of the dielectric layer 17. That is why as already described with reference to FIG. 19, the sidewall of the contact hole is formed by the insulating layers 12, 13 and the dielectric layer 17. And on the sidewall of the contact hole, the side surface of the first insulating layer 12 is aligned with that of the second insulating layer 13. In the Pix-COM connecting portion, the upper and lower transparent connecting layers 19cg and 15cg are connected together via the hole 17v of the dielectric layer 17.

By adopting such a configuration, it is possible to prevent the photoresist from reaching deep inside the hole 9u that has been cut through the gate insulating layer 5 and the protective layer 9 while the dielectric layer 17 is being formed. As a result, the exposure and development processes can be carried out more easily. On the other hand, this COM-G connecting portion 104(1) has such a layout in which three connecting portions are arranged separately, and therefore, should be allocated an increased chip area. For that reason, it is difficult to adopt such a configuration in a situation where the peripheral area 110 does not have plenty of margins.

The COM-G connecting portion 104(2) shown in FIG. 21(c) is also arranged between the display area 120 and the terminal portion (source terminal portion) 102, for example. In this example, a single connecting portion (G-Pix connecting portion) is formed by stacking the G-S and S-Pix connecting portions one upon the other. That is why the COM-G connecting portion 104(2) has a layout in which the G-Pix connecting portion and the Pix-COM connecting portion are provided as two separate portions. As a result, this COM-G connecting portion 104(2) can have a smaller size than the COM-G connecting portion 104(1) shown in FIG. 21(a) thanks to the layout. Optionally, a single hole may be formed by combining the holes 17u and 17v of the dielectric layer 17 together. Then, the size can be further reduced. Nevertheless, while the dielectric layer 17 is being formed, the photoresist could reach deep inside the depression of the hole 9u that has been cut through the insulating layer 5 and the protective layer 9, thus possibly making it difficult to carry out the exposure and development processes. This can be a factor in a decrease in exposure takt.

The COM-S connecting portion 104' shown in FIG. 21(b) may have been formed between the display area 120 and the terminal portion (gate terminal portion) 102, for example.

The COM-S connecting portion 104' has a layout in which a connecting portion to connect the upper conductive layer 11cg and the upper transparent connecting layer 19cg together (i.e., an S-Pix connecting portion) and a connecting portion to connect the upper and lower transparent connecting layers 19cg and 15cg together (i.e., a Pix-COM connecting portion) are provided as two separate portions when viewed along a normal to the substrate 1. The upper conductive layer 11cg may be the COM signal line Sam shown in FIG. 1, for example. In the S-Pix connecting portion, the upper conductive layer 11cg and the upper transparent connecting layer 19cg are connected together via the hole 13u that has been cut through the insulating layers 12, 13 and the hole 17u that has been cut through the dielectric layer 17. In this example, the hole 13u of the insulating layer 13 is arranged so as to intersect with the hole 17u of the dielectric layer 17. That is why the hole is cut through a portion of the insulating layer 12 where these holes 13u and 17u overlap with each other. Consequently, on the sidewall of the contact hole, a portion of the side surface of the insulating layer 12 is aligned with that of the insulating layer 13 and another portion of the side surface of the insulating layer 12 is aligned with that of the dielectric layer 17. In the Pix-COM connecting portion, the upper and lower transparent connecting layers 19cg and 15cg are connected together via the hole 17v of the dielectric layer 17.

Just like the COM-G connecting portion 104(1), the COM-S connecting portion 104' can also prevent the photoresist from reaching deep inside the depression of the hole 9u that has been cut through the insulating layer 5 and the protective layer 9 while the dielectric layer 17 is being formed. In addition, since there is no need to form the G-S connecting portion, this COM-S connecting portion 104' can have a smaller size than the COM-G connecting portion 104(1). However, a restriction will be imposed on the wiring structure in the peripheral area. For example, in that case, at least a part of the COM signal line needs to be formed out of the same conductive film as the source line 11 (or the COM signal line $G_{COM}$ may be changed into the COM signal line in a region where neither the COM-S connecting portion nor the COM-G connecting portion has been formed). In addition, each of the other signal lines to intersect with the COM signal line $S_{COM}$ with the COM-S connecting portion 104' needs to be formed out of the same conductive film as the gate line 3. Or another signal line which forms part of the same layer as the source line 11 may be changed into a line which forms part of the same layer as the gate line 3 only in the region where the COM-S connecting portion 104' has been formed.

Variation of S-G Connecting Portion 103

FIGS. 22(a) and 22(b) are plan views illustrating variations of the S-G connecting portion 103. It should be noted that the S-G connecting portion 103(1) shown in FIG. 22(a) is the same as the S-G connecting portion 103 shown in FIG. 4.

In the S-G connecting portion 103(1) shown in FIG. 22(a), a hole 9r is cut through the gate insulating layer 5 and the protective layer 9 so as to expose the upper surface and side surface (i.e., end face) of the lower conductive layer 3sg. That is why not only the upper surface but also the side surface of the lower conductive layer 3sg contribute to being connected to the upper conductive layer 11sg. On the other hand, through the S-G connecting portion 103(2) shown in FIG. 22(b), a hole 9r is cut through the gate insulating layer 5 and the protective layer 9 so that the upper surface of the lower conductive layer 3sg is exposed but its side surface (end face) is not exposed. That is why only the upper surface of the lower conductive layer 3sg contributes to being connected to the upper conductive layer 11sg.

The S-G connecting portion 103(1) can be used effectively in a situation where the gate line 3 and the lower conductive layer 3sg are formed by patterning a stack of multiple films, for example. In that case, a metal film to be used as the lowest layer of the stack is usually made of a material with high oxidation and corrosion resistance and with good connection stability. That is why by cutting the hole 9r so as to expose the side surface of the lower conductive layer 3sg, a connection path can be secured between the lowest metal film of the lower conductive layer 3sg and the upper conductive layer 11sg. As a result, a connecting portion with low resistance and good stability can be formed. Depending on the resistance value that the S-G connecting portion needs to have, however, the peripheral length (i.e., the circumferential edge length) of the lower conductive layer 3sg should be increased or any other measure should be taken to secure some area of contact between the lower and upper conductive layers 3sg and 11sg, for example. In that case, the S-G connecting portion would have an increased size to put an unwanted constraint on the layout in some cases.

In this S-G connecting portion 103(2), the area of contact between the lower and upper conductive layers 3sg and 11sg can be increased compared to the S-G connecting portion 103(1). That is why the S-G connecting portion can have a smaller overall size. This configuration is applicable particularly effectively to a situation where the constituent material of a surface portion of the lower conductive layer 3sg (i.e., the gate line layer) includes a material with good connection stability.

Variations of Terminal Portion 102

FIG. 23(a) through 23(e) are plan views illustrating exemplary variations of the terminal portion 102. It should be noted that the terminal portion 102(3) shown in FIG. 23(c) is the same as the terminal portion 102 shown in FIG. 5.

These terminal portions are arranged on a line that has been extended from the display area to the terminal portions (which will be referred to herein as an "extended line"), for example.

Although the extended lines on which the lower conductive layer 3t is arranged run in mutually different directions at the terminal portions 102(1) and 102(2) shown in FIGS. 23(a) and 23(b), these terminal portions 102(1) and 102(2) have similar configurations. The terminal portions 102(1) and 102(2) are arranged on an extended line 3L which has been formed out of the same conductive film as the gate line 3. That is why if these terminal portions are applied to the terminal portions on the gate signal side (i.e., gate terminal portions), for example, there is no need to change metals from the gate line layer into the source line layer, and the terminal portions can have an even smaller area. These configurations are applicable particularly effectively to a situation where the size of a peripheral area on the gate signal side has little margin, for example. On the other hand, if these configurations are applied to terminal portions on the source signal side (i.e., source terminal portions), then the metals should be changed at least once, and the areas of the terminal portions might increase.

Figure 23:
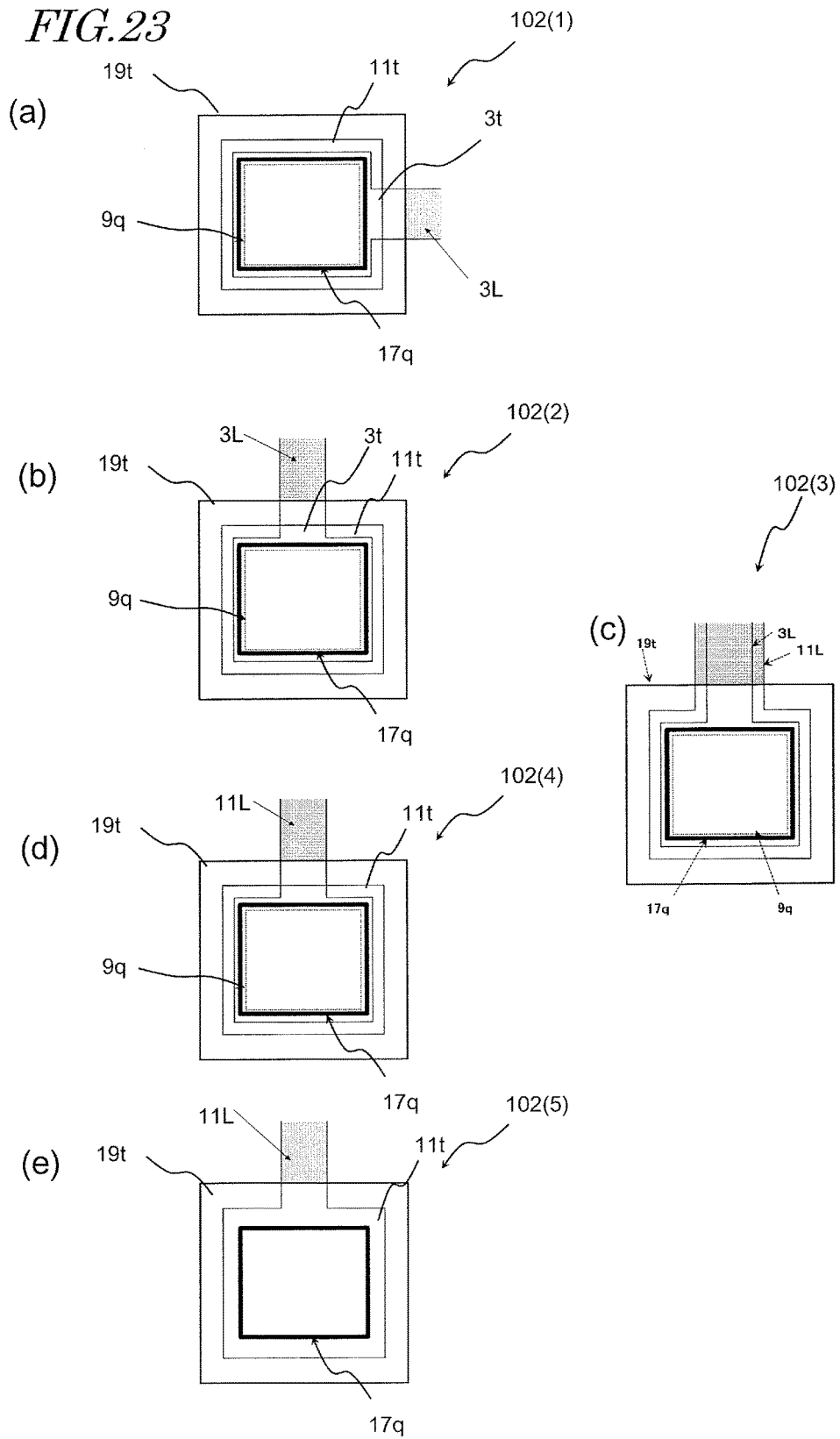
FIG. 23 Plan views illustrating variations of the terminal portion, wherein (a) through (e) illustrate terminal portions 102(1) through 102(5), respectively.

The terminal portion 102(3) shown in FIG. 23(*c*) is arranged on double-layered extended lines 3L and 11L which have been formed out of the gate line layer and the source line layer and which are stacked one upon the other. That is why compared to a situation where a single-layered extended line is used, the extended line resistance can be reduced between the terminal portions and the display area. In addition, since such extended lines have a redundant structure, disconnection can be avoided. However, to form such double-layered extended lines, at least one S-G connecting portion should be provided in the vicinity of the display area. That is why in designing a layout, an area needs to be allocated to the S-G connecting portion to form the extended lines. Also, if leakage between the extended lines is a problem, its probability of occurrence could double.

The terminal portions 102(4) and 102(5) shown in FIGS. 23(*d*) and 23(*e*) are arranged on an extended line 11L which has been formed out of the same conductive film as the source line 11. A conductive layer 3t which has been formed out of the gate line layer may be arranged in only the terminal pad portion (as in the terminal portion 102(4)) or may not be arranged there (as in the terminal portion 102(5)). If such terminal portions 102(4) and 102(5) are applied to terminal portions on the source signal side (i.e., source terminal portions), for example, then there is no need to change metals, and the terminal portions can have an even smaller area. These configurations are applicable particularly effectively to a situation where the size of a peripheral area on the source signal side has little margin, for example. On the other hand, if these configurations are applied to terminal portions on the gate signal side (i.e., gate terminal portions), then the metals should be changed at least once, and the areas of the terminal portions might increase.

INDUSTRIAL APPLICABILITY

Embodiments of the present invention are broadly applicable to any semiconductor device including a thin-film transistor and two transparent conductive layers on a substrate. Among other things, embodiments of the present invention are particularly effectively applicable to a semiconductor device including a thin-film transistor (such as an active-matrix substrate) and a display device including such a semiconductor device.

REFERENCE SIGNS LIST

1 substrate
3 gate line
3*a* gate electrode
3*t*, 3*sg*, 3*cg* lower conductive layer
5 gate insulating layer
7*a* semiconductor layer
9 protective layer
11 source line
11*s* source electrode
11*d* drain electrode
11*t*, 11*sg*, 11*cg* upper conductive layer
12 first insulating layer
13 second insulating layer
14 interlevel insulating layer
15 first transparent conductive layer
17 dielectric layer
19*a* second transparent conductive layer
100 semiconductor device
101 TFT
102 terminal portion
103 S-G connecting portion
104 COM-G connecting portion
104' COM-S connecting portion
105 contact portion
1000 liquid crystal display device

The invention claimed is:

1. A method for fabricating a semiconductor device including a thin-film transistor, the method comprising:
    (A) forming a thin-film transistor on a substrate by forming a gate line layer including a gate line and a gate electrode, forming a gate insulating layer on the gate electrode, forming a semiconductor layer on the gate insulating layer, and forming a source line layer including source and drain electrodes;
    (B) forming an interlevel insulating layer which covers the thin-film transistor and which includes a first insulating layer that contacts at least with the drain electrode;
    (C) forming a first transparent conductive layer with a first hole on the interlevel insulating layer;
    (D) forming a dielectric layer on the first transparent conductive layer and inside the first hole;
    (E) etching the dielectric layer and the first insulating layer simultaneously, thereby cutting a first contact hole that exposes a portion of the drain electrode, a side surface of the first hole being covered with the dielectric layer and being not exposed on a sidewall of the first contact hole; and
    (F) forming a second transparent conductive layer which contacts with the drain electrode in the first contact hole on the dielectric layer and in the first contact hole, wherein
    when viewed along a normal to the substrate, at least a part of a contact portion where the drain electrode and the second transparent conductive layer contact with each other in the first contact hole overlaps with the gate line layer,
    the interlevel insulating layer includes the first insulating layer and a second insulating layer,
    the step (B) includes: forming the first insulating layer out of an inorganic insulating film, forming the second insulating layer out of an organic insulating film on the first insulating layer, and cutting a fourth hole through the second insulating layer,
    in the step (D), the dielectric layer is formed on the first transparent conductive layer and inside the first and fourth holes,
    in the step (E), the etching is carried out so that the dielectric layer and the first insulating layer are etched but the second insulating layer is not etched,
    in the step (E), a second hole is formed in the dielectric layer and a third hole is formed in the first insulating layer by the etching, and
    the sidewall of the first contact hole includes respective side surfaces of the second hole, the third hole, and the fourth hole, and includes a first portion in which the side surfaces of the second hole and the third hole are aligned with each other and a second portion in which the side surfaces of the third hole and the fourth hole are aligned with each other.

2. The method of claim 1, wherein, when viewed along the normal to the substrate, an outer edge of the second hole of the dielectric layer and an outer edge of the fourth hole of the second insulating layer intersect with each other at two points.

3. The method of claim 1, wherein the semiconductor layer is an oxide semiconductor layer.

4. The method of claim 3, wherein the oxide semiconductor layer is an In—Ga—Zn—O (IGZO) layer.

* * * * *